(12) United States Patent
He et al.

(10) Patent No.: US 12,406,709 B2
(45) Date of Patent: Sep. 2, 2025

(54) STORAGE DEVICE AND PREPARATION METHOD, READ-WRITE METHOD, STORAGE CHIP AND ELECTRONIC DEVICE

(71) Applicant: HUAWEI TECHNOLOGIES CO., LTD., Guangdong (CN)

(72) Inventors: Liang He, Nanjing (CN); Xin Yan, Shenzhen (CN); Yafei Zhao, Nanjing (CN); Jiai Ning, Nanjing (CN); Junfeng Zhao, Shenzhen (CN); Wentao Tang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 160 days.

(21) Appl. No.: 18/216,435

(22) Filed: Jun. 29, 2023

(65) Prior Publication Data

US 2023/0343378 A1 Oct. 26, 2023

Related U.S. Application Data

(63) Continuation of application No. PCT/CN2021/141685, filed on Dec. 27, 2021.

(30) Foreign Application Priority Data

Dec. 31, 2020 (CN) .......................... 202011631814.7

(51) Int. Cl.
*G11C 11/00* (2006.01)
*G11C 11/16* (2006.01)
(Continued)

(52) U.S. Cl.
CPC ........ *G11C 11/161* (2013.01); *G11C 11/1673* (2013.01); *G11C 11/1675* (2013.01);
(Continued)

(58) Field of Classification Search
CPC .... G06F 3/0605; G06F 3/0616; G06F 3/0659; G06F 3/0679; G11C 11/16;
(Continued)

(56) References Cited

U.S. PATENT DOCUMENTS 10,204,678 B2 2/2019 Klein et al.
10,381,406 B1 8/2019 Jacob et al.
(Continued)

FOREIGN PATENT DOCUMENTS

CN 109065707 A 12/2018
CN 109904309 A 6/2019
(Continued)

OTHER PUBLICATIONS

"STT-MRAM",STT-MRAM, MRAM-Info, [online]https://www.mram-info.com/stt-mram, (Sep. 21, 2024), total 9 pages.
(Continued)

*Primary Examiner* — Thong Q Le
(74) *Attorney, Agent, or Firm* — WOMBLE BOND DICKINSON (US) LLP

(57) ABSTRACT

Embodiments of this application provide a storage component, a preparation method, a reading/writing method, a storage chip, and an electronic device, is related to the storage technology field, and is used to resolve a problem that a quantity of storage states of a spin orbit torque-magnetic random access memory is increased while a storage state change range remains unchanged. The storage component includes: a first magnetic tunnel junction, a spin orbit coupling layer and a second magnetic tunnel junction that are sequentially arranged in a stacked manner. The first magnetic tunnel junction includes a first free layer, and the second magnetic tunnel junction includes a second free
(Continued)

100 layer. The first free layer and the second free layer are arranged on two opposite surfaces of the spin orbit coupling layer.

20 Claims, 24 Drawing Sheets

(51) Int. Cl.
    *H10B 61/00*         (2023.01)
    *H10N 50/01*         (2023.01)
    *H10N 50/10*         (2023.01)

(52) U.S. Cl.
    CPC .......... *G11C 11/1697* (2013.01); *H10B 61/00* (2023.02); *H10N 50/01* (2023.02); *H10N 50/10* (2023.02)

(58) Field of Classification Search
    CPC .............. G11C 11/161; G11C 11/1673; G11C 11/1675; G11C 11/18; G11C 11/1655; G11C 11/1657; G11C 11/1659; G11C 11/5607; G11C 11/15; G11C 11/005; G11C 11/5692; G11C 17/02; G11C 17/16; G11C 17/165; G11C 17/18; G11C 11/4074; G11C 11/4094; G11C 11/165; G11C 7/1096; G11C 8/12; G11C 2211/5615; G11C 11/1697; G11C 2211/561; G11C 2211/562; G11C 2211/563; G11C 2211/564; G11C 5/147; H10B 43/20; H10B 61/00

See application file for complete search history.

(56) References Cited

U.S. PATENT DOCUMENTS

| | | | |
|---|---|---|---|
| 10,585,630 | B2 * | 3/2020 | Rakshit ................ H10D 84/038 |
| 2015/0213868 | A1 | 7/2015 | Wu et al. |
| 2019/0259810 | A1 | 8/2019 | Jacob et al. |

FOREIGN PATENT DOCUMENTS

| | | |
|---|---|---|
| CN | 109923686 A | 6/2019 |
| CN | 113937127 A | 1/2022 |
| WO | 2019156736 A1 | 8/2019 |

OTHER PUBLICATIONS

Farhana Parveen et al: "Low Power In-Memory Computing based on Dual-Mode SOT-MRAM", Aug. 11, 2017, total 6 pages.

* cited by examiner

Medium resistive state---
High resistive state

High resistive state---
Medium resistive state

Medium resistive state---
Low resistive state

Low resistive state---
Medium resistive state

Low resistive state---
High resistive state

STORAGE DEVICE AND PREPARATION METHOD, READ-WRITE METHOD, STORAGE CHIP AND ELECTRONIC DEVICE

CROSS-REFERENCE TO RELATED APPLICATIONS

This application is a continuation of International Application No. PCT/CN2021/141685, filed on Dec. 27, 2021, which claims priority to Chinese Patent Application No. 202011631814.7, filed on Dec. 31, 2020. The disclosures of the aforementioned applications are hereby incorporated by reference in their entireties.

TECHNICAL FIELD

This application relates to the field of storage technologies, and in particular, to a storage component, a preparation method, a reading/writing method, a storage chip, and an electronic device.

BACKGROUND

A spin orbit torque magnetic random access memory (SOT-MRAM) has become a research hotspot in fields of spin electronics and magnetic information storage due to its fast write speed, low write current, and good compatibility.

Currently, the SOT-MRAM has only two states: a high resistive state and a low resistive state. Therefore, a binary read/write mode is usually used, and a storage density of the SOT-MRAM is relatively low. To improve the storage density of the SOT-MRAM by increasing a quantity of storage states of the SOT-MRAM, a person skilled in the art proposes an SOT-MRAM. As shown in FIG. 1, the SOT-MRAM includes a spin orbit coupling (SOC) layer 20 and a magnetic tunnel junction (MTJ) 30 arranged on the SOC layer 20. There are doped ions in the MTJ 30, and the doped ions have a concentration gradient. In a preparation process, the SOC layer 20 having a spin orbit coupling effect is first grown on a substrate, and then the MTJ 30 is grown. Then, a mask layer is formed in partial area of the MTJ 30, and then ions are injected, so as to inject the ions into an area that is of the MTJ 30 and that is not masked. Then, thermal annealing is performed, so that a small quantity of doped ions are also diffused in the area of the MTJ 30 in which no doped ions are injected. In this way, in a plane in which the SOC layer 20 is located and in a direction perpendicular to a current direction, the doped ions in the MTJ 30 have a concentration gradient.

Based on the SOT-MRAM shown in FIG. 1, because there is a concentration gradient in the MTJ 30, deflection directions after magnetization are also different, and symmetrical damage is formed in the direction perpendicular to the current direction. When a current is input into the SOC layer 20, no external magnetic field is required, and a magnetic resistance is linearly output with the current in a multi-state manner, so that multi-state storage is implemented.

However, a preparation process of the SOT-MRAM shown in FIG. 1 is relatively complex, and it is difficult to implement an instrument and a process for performing directional ion doping on the MTJ 30. In addition, after directional doping is performed on the MTJ 30, although multi-state storage can be implemented, a resistance change range of the MTJ 30 (that is, a difference or a ratio between a highest resistance and a lowest resistance of the MTJ 30) is still the same as that of an MTJ 30 in the SOT-MRAM that has only the high resistive state and the low resistive state, and a higher resistance change range cannot be obtained. However, the quantity of storage states is increased, while the resistance change range remains unchanged (for example, for a resistance change range of 1000 ohms to 2500 ohms, previously, 1000 ohms corresponds to one storage state, and 2500 ohms corresponds to one storage state; and now, 1000 ohms corresponds to one storage state, 1750 ohms corresponds to one storage state, and 2500 ohms corresponds to one storage state). Consequently, a difference between resistance values corresponding to the storage states is relatively small, and accuracy of SOT-MRAM read/write is affected.

SUMMARY

Embodiments of this application provide a storage component, a preparation method, a reading/writing method, a storage chip, and an electronic device, to resolve a problem that a quantity of storage states of an SOT-MRAM is increased while a storage state change range remains unchanged.

To achieve the foregoing objectives, the following technical solutions are used in this application.

According to a first aspect of embodiments of this application, a storage component is provided, including a first magnetic tunnel junction, a spin orbit coupling layer, and a second magnetic tunnel junction that are sequentially arranged in a stacked manner, where the first magnetic tunnel junction includes a first free layer, the second magnetic tunnel junction includes a second free layer, and the first free layer and the second free layer are arranged on two opposite surfaces of the spin orbit coupling layer. The storage component provided in this embodiment of this application has three storage states: a low resistive state, a medium resistive state, and a high resistive state. However, for a conventional storage component, when a magnetization direction of a fixed layer is parallel to that of a free layer, the storage component is in a low resistive state, and when a magnetization direction of the fixed layer is antiparallel to that of the free layer, the storage component is in a high resistive state. There are only two storage states. Therefore, according to the storage component provided in this embodiment of this application, a quantity of storage states can be increased, multi-state storage can be implemented, and a storage density of the storage component can be improved.

In some embodiments, the first magnetic tunnel junction and the second magnetic tunnel junction are of a same structure. In this way, the first magnetic tunnel junction and the second magnetic tunnel junction may be prepared by using a same process, and the preparation process may be simplified.

In some embodiments, the first magnetic tunnel junction further includes a first tunneling layer and a first fixed layer that are sequentially arranged on the first free layer in a stacked manner. The structure is simple.

In some embodiments, the second magnetic tunnel junction further includes a second tunneling layer and a second fixed layer that are sequentially arranged on the second free layer in a stacked manner. The structure is simple.

In some embodiments, the storage component further includes a first electrode and a second electrode, where the first electrode and the second electrode are coupled to two opposite sides of the spin orbit coupling layer.

In some embodiments, the storage component further includes a third electrode and a fourth electrode. The third electrode is coupled to the first fixed layer of the first magnetic tunnel junction, and the fourth electrode is coupled to the second fixed layer of the second magnetic tunnel junction.

In some embodiments, the second electrode, the third electrode, and the fourth electrode are separately coupled to a reference ground end.

According to a second aspect of embodiments of this application, a storage chip is provided, including the storage component according to any one of the first aspect. The storage chip provided in this embodiment of this application includes the storage component. Beneficial effects of the storage chip are the same as those of the storage component. Details are not described herein again.

In some embodiments, the storage chip further includes a differential amplifier. A first input end of the differential amplifier is coupled to the third electrode of the storage component, and a second input end of the differential amplifier is coupled to the fourth electrode of the storage component. The differential amplifier is used for amplifying a difference between a first current output from the third electrode and a second current output from the fourth electrode is amplified by a fixed gain, and then outputting an amplified difference, so that output currents in different resistive states have a higher degree of differentiation, thereby obtaining a resistive state corresponding to a read instruction more accurately, and reading data with higher accuracy.

In some embodiments, the first input end of the differential amplifier is coupled to multiple third electrodes, and the second input end of the differential amplifier is coupled to multiple fourth electrodes. The storage chip further includes a time-sharing read control circuit. The time-sharing read control circuit is coupled to the storage component, and is configured to send a time-sharing read instruction to the storage component, so that the multiple third electrodes transmit signals to the first input end of the differential amplifier in a time-sharing manner, and the multiple fourth electrodes transmit signal to the second input end of the differential amplifier in a time-sharing manner. In this way, a quantity of differential amplifiers can be reduced, and an area of the storage chip can be reduced.

According to a third aspect of embodiments of this application, a preparation method of a storage component is provided, including: forming, on a substrate, a first magnetic tunnel junction, a spin orbit coupling layer, and a second magnetic tunnel junction that are sequentially arranged in a stacked manner, where the first magnetic tunnel junction includes a first free layer, the second magnetic tunnel junction includes a second free layer, and the first free layer and the second free layer are arranged on two opposite surfaces of the spin orbit coupling layer. In this embodiment of this application, during forming of the storage component, a related doping process does not need to be performed, a process is simple, and production efficiency is high.

In some embodiments, the forming, on a substrate, a first magnetic tunnel junction, a spin orbit coupling layer, and a second magnetic tunnel junction that are sequentially arranged in a stacked manner includes: forming a first fixed thin film on the substrate; forming a first tunneling thin film on a surface that is of the first fixed thin film and that is away from the substrate; forming a first free thin film on a surface that is of the first tunneling thin film and that is away from the first fixed thin film; and forming a spin orbit coupling thin film on a surface that is of the first free thin film and that is away from the first tunneling thin film; forming a second free thin film on a surface that is of the spin orbit coupling thin film and that is away from the first free thin film; forming a second tunneling thin film on a surface that is of the second free thin film and that is away from the spin orbit coupling thin film; forming a second fixed thin film on a surface that is of the second tunneling thin film and that is away from the second free thin film; and patterning the first fixed thin film, the first tunneling thin film, the first free thin film, the spin orbit coupling thin film, the second free thin film, the second tunneling thin film, and the second fixed thin film by using a patterning process, to form the first magnetic tunnel junction that is formed by sequentially stacking a first fixed layer, a first tunneling layer, and the first free layer, the spin orbit coupling layer, and the second magnetic tunnel junction that is formed by sequentially stacking the second free layer, a second tunneling layer, and a second fixed layer.

The first fixed thin film, the first tunneling thin film, the first free thin film, the spin orbit coupling thin film, the second free thin film, the second tunneling thin film, and the second fixed thin film are first formed, and then the foregoing film layers are patterned by using the patterning process, to form the first magnetic tunnel junction, the spin orbit coupling layer, and the second magnetic tunnel junction. The process is mature with fewer process operations, and preparation efficiency is high. In addition, the first magnetic tunnel junction, the spin orbit coupling layer, and the second magnetic tunnel junction that are obtained by means of preparation have equal sizes, so that an area occupied by the storage component can be reduced.

According to a fourth aspect of embodiments of this application, a reading method of a storage component is provided. The storage component includes a first magnetic tunnel junction, a spin orbit coupling layer, and a second magnetic tunnel junction that are sequentially arranged in a stacked manner. The reading method of a storage component includes: applying a voltage signal to the spin orbit coupling layer; reading an output current of the spin orbit coupling layer; and obtaining, based on the output current of the spin orbit coupling layer, data stored in the first magnetic tunnel junction and the second magnetic tunnel junction.

A magnitude of the output current of the spin orbit coupling layer varies with a magnetization direction of a first free layer in the first magnetic tunnel junction and a magnetization direction of a second free layer in the second magnetic tunnel junction. Each resistive state has a magnetization direction of the first free layer and a magnetization direction of the second free layer that are corresponding to the resistive state. Therefore, the magnetization direction of the first free layer and the magnetization direction of the second free layer may be determined by detecting the output current of the spin orbit coupling layer, so as to determine which resistive state of a high resistive state, a medium resistive state, or a low resistive state needs to be read by a read instruction of the storage component, so that the data stored in the first magnetic tunnel junction and the second magnetic tunnel junction is obtained. The principle is simple, and data of multiple resistive states is easily read.

In some embodiments, the obtaining, based on the output current of the spin orbit coupling layer, data stored in the first magnetic tunnel junction and the second magnetic tunnel junction includes: reading a low resistive state when $I_{out}=I_{in}+I_{ish}$; reading a medium resistive state when $I=I+½I_{ish}$; or reading a high resistive state when $I_{out}=I_{in}$. $I_{out}$ is the output current, $I_{in}$ is an in-plane current generated after the voltage signal is applied to the spin orbit coupling layer, and $I_{ish}$ is an inverse spin Hall current generated by an inverse spin Hall effect after the voltage signal is applied to the spin orbit coupling layer.

According to a fifth aspect of embodiments of this application, a reading method of a storage component is provided, where the storage component includes a first magnetic tunnel junction, a spin orbit coupling layer, and a second magnetic tunnel junction that are sequentially arranged in a stacked manner; and the reading method of a storage component includes: applying a voltage signal to the spin orbit coupling layer; and reading an output current of the first magnetic tunnel junction and an output current of the second magnetic tunnel junction; and obtaining, based on the output current of the first magnetic tunnel junction and the output current of the second magnetic tunnel junction, data stored in the first magnetic tunnel junction and the second magnetic tunnel junction.

A differential amplifier is used for amplifying a difference between a first current output by the first magnetic tunnel junction and a second current output by the second magnetic tunnel junction by a fixed gain, and then outputting an amplified difference, so that output currents in different resistive states have a higher degree of differentiation, thereby obtaining a resistive state corresponding to a read instruction more accurately, and reading data with higher accuracy.

In some embodiments, the obtaining, based on the output current of the first magnetic tunnel junction and the output current of the second magnetic tunnel junction, data stored in the first magnetic tunnel junction and the second magnetic tunnel junction includes: reading a low resistive state when Iout'>0; reading a medium resistive state when Iout'=0; or reading a high resistive state when Iout'<0, where Iout' is a difference between the output current of the first magnetic tunnel junction and the output current of the second magnetic tunnel junction. A data processing volume can be reduced.

According to a sixth aspect of embodiments of this application, a writing method of a storage component is provided. The storage component includes a first magnetic tunnel junction, a spin orbit coupling layer, and a second magnetic tunnel junction that are sequentially arranged in a stacked manner. The writing method of a storage component includes: separately applying a voltage signal to the spin orbit coupling layer and at least one of the first magnetic tunnel junction and the second magnetic tunnel junction, where the voltage signal is used to change resistive states of the first magnetic tunnel junction and the second magnetic tunnel junction, so as to write corresponding data into the storage component.

According to the storage component provided in this embodiment of this application, the first magnetic tunnel junction 40 has two resistive states: a low resistive state and a high resistive state, and the second magnetic tunnel junction 50 also has two resistive states: a low resistive state and a high resistive state. Therefore, after mixed combination, the storage component 100 has three states: a low resistive state, a medium resistive state, and a high resistive state. Compared with a conventional storage component in which a low resistive state and a high resistive state are formed based on parallelism or antiparallelism between a free layer and a fixed layer, the storage component provided in this embodiment of this application can implement multi-state storage. In addition, intervals between magnitudes of three types of output currents of the spin orbit coupling layer are relatively large, and a corresponding interval between the low resistive state and the high resistive state is also relatively large, so that a resistive state value range is enlarged. When the resistive state value range is enlarged, a difference between the resistive states may be increased, so that a degree of differentiation among the resistive states is increased, and read/write accuracy is improved. In addition, in the storage component 100 provided in this embodiment of this application, mutual conversion among the resistive states is completed under a joint action of a spin orbit torque effect and a spin transfer torque effect, so as to complete data writing with high working efficiency.

In some embodiments, the separately applying a voltage signal to the spin orbit coupling layer and at least one of the first magnetic tunnel junction and the second magnetic tunnel junction includes: separately applying the voltage signal to the spin orbit coupling layer and one of the first magnetic tunnel junction and the second magnetic tunnel junction, where the voltage signal is used to change a resistive state of one of the first magnetic tunnel junction and the second magnetic tunnel junction, so as to change a resistive state of the storage component, and write, into the storage component, data corresponding to the resistive state of the storage component.

In some embodiments, the separately applying a voltage signal to the spin orbit coupling layer and at least one of the first magnetic tunnel junction and the second magnetic tunnel junction includes: separately applying the voltage signal to the first magnetic tunnel junction, the second magnetic tunnel junction, and the spin orbit coupling layer, where the voltage signal is used to change resistive states of the first magnetic tunnel junction and the second magnetic tunnel junction, so as to change a resistive state of the storage component, and write, into the storage component, data corresponding to the resistive state of the storage component.

In some embodiments, the separately applying the voltage signal to the first magnetic tunnel junction and the spin orbit coupling layer includes: applying a positive voltage signal to the spin orbit coupling layer, and applying a positive voltage signal to the first magnetic tunnel junction. In this way, under an action of a spin orbit torque effect of the spin orbit coupling layer and a spin transfer torque effect of the first magnetic tunnel junction, a magnetization direction of a first free layer is reversed to facing away from the spin orbit coupling layer, the first magnetic tunnel junction changes to be in the high resistive state, the storage component changes to be in the high resistive state from the medium resistive state, and data corresponding to the high resistive state is written into the storage component.

In some embodiments, the separately applying the voltage signal to the first magnetic tunnel junction and the spin orbit coupling layer includes: applying a negative voltage signal to the spin orbit coupling layer, and applying a negative voltage signal to the first magnetic tunnel junction. In this way, under an action of a spin orbit torque effect of the spin orbit coupling layer and a spin transfer torque effect of the first magnetic tunnel junction, a magnetization direction of a first free layer is reversed to facing toward the spin orbit coupling layer, the first magnetic tunnel junction changes to be in the low resistive state, the storage component changes to be in the medium resistive state from the high resistive state, and data corresponding to the medium resistive state is written into the storage component.

In some embodiments, the separately applying the voltage signal to the first magnetic tunnel junction and the spin orbit coupling layer includes: applying a negative voltage signal to the spin orbit coupling layer, and applying a negative voltage signal to the first magnetic tunnel junction. In this way, under an action of a spin orbit torque effect of the spin orbit coupling layer and a spin transfer torque effect of the first magnetic tunnel junction, a magnetization direction of a first free layer is reversed to facing toward the spin orbit coupling layer, the first magnetic tunnel junction changes to be in the low resistive state, the storage component changes to be in the low resistive state from the medium resistive state, and data corresponding to the low resistive state is written into the storage component.

In some embodiments, the separately applying the voltage signal to the first magnetic tunnel junction and the spin orbit coupling layer includes: applying a positive voltage signal to the spin orbit coupling layer, and applying a positive voltage signal to the first magnetic tunnel junction. In this way, under an action of a spin orbit torque effect of the spin orbit coupling layer and a spin transfer torque effect of the first magnetic tunnel junction, a magnetization direction of a first free layer is reversed to facing away from the spin orbit coupling layer, the first magnetic tunnel junction changes to be in the high resistive state, the storage component changes to be in the medium resistive state from the low resistive state, and data corresponding to the medium resistive state is written into the storage component.

In some embodiments, the separately applying the voltage signal to the second magnetic tunnel junction and the spin orbit coupling layer includes: applying a negative voltage signal to the spin orbit coupling layer, and applying a positive voltage signal to the second magnetic tunnel junction. In this way, under an action of a spin orbit torque effect of the spin orbit coupling layer and a spin transfer torque effect of the second magnetic tunnel junction, a magnetization direction of a second free layer is reversed to facing toward the spin orbit coupling layer, the second magnetic tunnel junction changes to be in the high resistive state, the storage component changes to be in the low resistive state from the medium resistive state, and data corresponding to the low resistive state is written into the storage component.

In some embodiments, the separately applying the voltage signal to the second magnetic tunnel junction and the spin orbit coupling layer includes: applying a positive voltage signal to the spin orbit coupling layer and applying a negative voltage signal to the second magnetic tunnel junction according to a write instruction. In this way, under an action of a spin orbit torque effect of the spin orbit coupling layer and a spin transfer torque effect of the second magnetic tunnel junction, a magnetization direction of a second free layer is reversed to facing away from the spin orbit coupling layer, the second magnetic tunnel junction changes to be in the low resistive state, the storage component changes to be in the medium resistive state from the low resistive state, and data corresponding to the medium resistive state is written into the storage component.

In some embodiments, the separately applying the voltage signal to the second magnetic tunnel junction and the spin orbit coupling layer includes: applying a positive voltage signal to the spin orbit coupling layer and applying a negative voltage signal to the second magnetic tunnel junction according to a write instruction. In this way, under an action of a spin orbit torque effect of the spin orbit coupling layer and a spin transfer torque effect of the second magnetic tunnel junction, a magnetization direction of a second free layer is reversed to facing away from the spin orbit coupling layer, the second magnetic tunnel junction changes to be in the low resistive state, the storage component changes to be in the high resistive state from the medium resistive state, and data corresponding to the high resistive state is written into the storage component.

In some embodiments, the separately applying the voltage signal to the second magnetic tunnel junction and the spin orbit coupling layer includes: applying a negative voltage signal to the spin orbit coupling layer and applying a positive voltage signal to the second magnetic tunnel junction according to a write instruction. In this way, under an action of a spin orbit torque effect of the spin orbit coupling layer and a spin transfer torque effect of the second magnetic tunnel junction, a magnetization direction of a second free layer is reversed to facing toward the spin orbit coupling layer, the second magnetic tunnel junction changes to be in the high resistive state, the storage component changes to be in the medium resistive state from the high resistive state, and data corresponding to the medium resistive state is written into the storage component.

In some embodiments, the separately applying the voltage signal to the spin orbit coupling layer, the first magnetic tunnel junction, and the second magnetic tunnel junction includes: applying a positive voltage signal to the spin orbit coupling layer, applying a positive voltage signal to the first magnetic tunnel junction, and applying a negative voltage signal to the second magnetic tunnel junction. In this way, under an action of a spin orbit torque effect of the spin orbit coupling layer and a spin transfer torque effect of the first magnetic tunnel junction, a magnetization direction of a first free layer is reversed to facing away from the spin orbit coupling layer, and the first magnetic tunnel junction changes to be in the high resistive state; and under an action of a spin orbit torque effect of the spin orbit coupling layer and a spin transfer torque effect of the second magnetic tunnel junction, a magnetization direction of a second free layer is reversed to facing away from the spin orbit coupling layer, the second magnetic tunnel junction changes to be in the low resistive state, the storage component changes to be in the high resistive state from the low resistive state, and data corresponding to the high resistive state is written into the storage component.

In some embodiments, the separately applying the voltage signal to the spin orbit coupling layer, the first magnetic tunnel junction, and the second magnetic tunnel junction includes: applying a negative voltage signal to the spin orbit coupling layer, applying a negative voltage signal to the first magnetic tunnel junction, and applying a positive voltage signal to the second magnetic tunnel junction. In this way, under an action of a spin orbit torque effect of the spin orbit coupling layer and a spin transfer torque effect of the first magnetic tunnel junction, a magnetization direction of a first free layer is reversed to facing toward the spin orbit coupling layer, and the first magnetic tunnel junction changes to be in the low resistive state; and under an action of a spin orbit torque effect of the spin orbit coupling layer and a spin transfer torque effect of the second magnetic tunnel junction, a magnetization direction of a second free layer is reversed to facing toward the spin orbit coupling layer, the second magnetic tunnel junction changes to be in the high resistive state, the storage component changes to be in the low resistive state from the high resistive state, and data corresponding to the low resistive state is written into the storage component.

According to a seventh aspect of embodiments of this application, an electronic device is provided, including the storage chip provided in the second aspect.

Beneficial effects of the electronic device provided in this embodiment of this application are the same as beneficial effects of the foregoing storage chip, and details are not described herein again.

In some embodiments, the electronic device further includes a circuit board, and the storage chip is coupled to the circuit board.

According to an eighth aspect of embodiments of this application, a computer-readable storage medium is provided, including computer instructions. When the computer instructions are run on an electronic device, the electronic device is enabled to perform the reading method according to any one of the fourth aspect or the fifth aspect or perform the writing method according to any one of the sixth aspect.

According to a ninth aspect of embodiments of this application, a computer program product is provided. When the computer program product is run on a computer, the computer is enabled to perform the reading method according to any one of the fourth aspect or the fifth aspect or perform the writing method according to any one of the sixth aspect.

BRIEF DESCRIPTION OF DRAWINGS

FIG. 5b-1 and FIG. 5b-2 are diagrams of a preparation process of a storage component according to an embodiment of this application;

FIG. 6b-1 and FIG. 6b-2 are diagrams of another preparation process of a storage component according to an embodiment of this application;

DESCRIPTION OF EMBODIMENTS

The following describes the technical solutions in embodiments of this application with reference to the accompanying drawings in embodiments of this application. It is clearly that the described embodiments are merely some but not all the embodiments of this application.

The following terms "first", "second" and the like are merely intended for ease of description, and shall not be understood as an indication or implication of relative importance or implicit indication of a quantity of indicated technical features. Therefore, a feature limited by "first", "second" and the like may explicitly indicate or implicitly include one or more such features. In description of this application, unless otherwise stated, "multiple" means two or more than two.

In addition, in embodiments of this application, orientation terms such as "upper", "lower", "left", and "right" may be defined by, but are not limited to, orientations of components schematically placed in the accompanying drawings. It should be understood that these orientation terms may be relative concepts, are used for description and clarification of "relative to", and may be changed correspondingly based on changes in placement orientations of the components in the accompanying drawings.

In this application, unless otherwise specified and limited, the term "connection" should be understood in a broad sense. For example, the "connection" may be a fixed connection, a detachable connection, an integration, a direct connection, or an indirect connection by using an intermediate medium. In addition, the term "electrical connection" may be a direct electrical connection, or may be an indirect electrical connection through an intermediate medium.

An embodiment of this application provides an electronic device. The electronic device may be an electronic product such as a mobile phone, a tablet computer (pad), a television, an intelligent wearable product (for example, a smartwatch or a smart band), a virtual reality (VR) terminal device, an augmented reality (AR) terminal device, a small rechargeable household appliance (for example, a soybean milk machine or a robot vacuum cleaner), and an uncrewed aerial vehicle. A form of the electronic device is not limited in this embodiment of this application.

Figure 2:
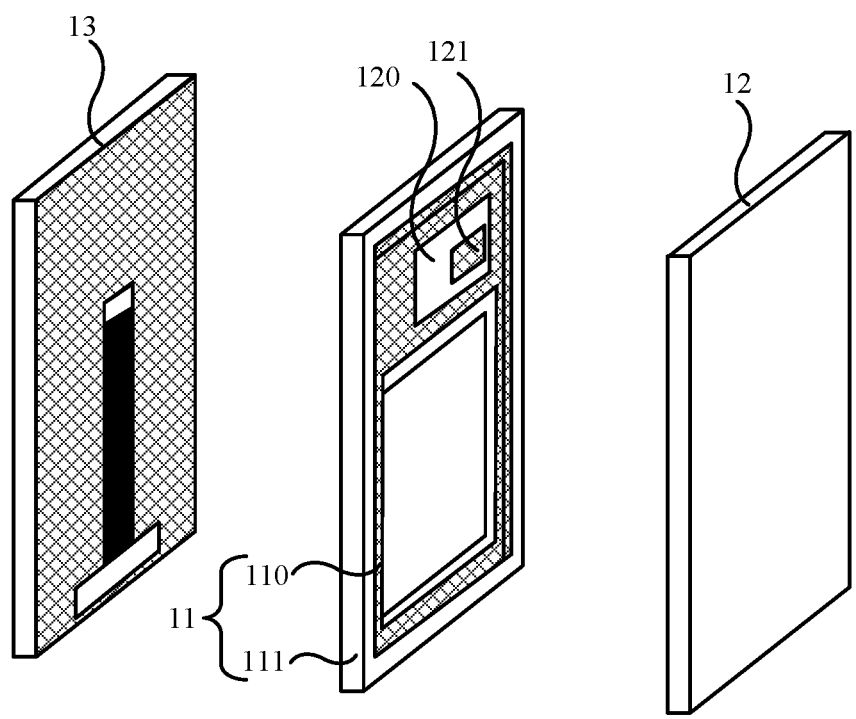
FIG. 2 is a diagram of a structure of an electronic device according to an embodiment of this application.

An example in which any one of the foregoing electronic devices is a mobile phone is used. As shown in FIG. 2, the electronic device 01 may include a middle frame 11, a rear housing 12, and a display screen 13. The middle frame 11 includes a bearing plate 110 configured to bear the display screen 13, and a frame 111 surrounding the bearing plate 110. The electronic device 01 may include a circuit board 120 disposed on a surface that is of the bearing plate 110 and that faces the rear housing 12. The circuit board 120 is, for example, a printed circuit board (PCB). The electronic device 01 further includes some electronic components 121 disposed on the circuit board 120. The electronic components 121 include, for example, a storage chip. The rear housing 12 is connected to the middle frame 11, so as to prevent external vapor and dust from affecting performance of the circuit board 120 and the electronic components 121.

The storage chip includes a storage component and a peripheral circuit configured to perform read/write on the storage component.

Figure 3:
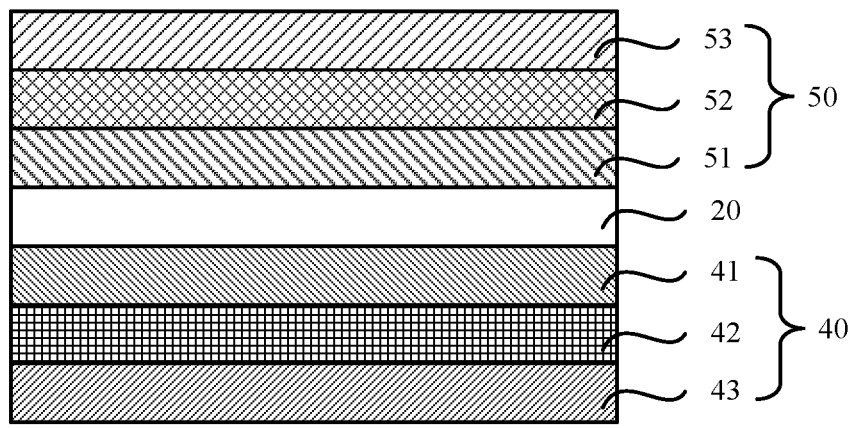
FIG. 3 is a diagram of a structure of a storage component according to an embodiment of this application.

An embodiment of this application provides a storage component. As shown in FIG. 3, a storage component 100 includes a first magnetic tunnel junction (MTJ) 40, a spin orbit coupling (SOC) layer 20, and a second magnetic tunnel junction 50 that are sequentially arranged in a stacked manner.

In a possible embodiment, a structure of the first magnetic tunnel junction 40 is shown in FIG. 3. The first magnetic tunnel junction 40 includes a first free layer 41, a first tunneling layer 42, and a first fixed layer 43 that are sequentially arranged in a stacked manner.

With respect to a structure of the first free layer 41, to simplify a preparation process, in a possible embodiment, the first free layer 41 is of a single-layer film layer structure.

In another possible embodiment, the first free layer 41 is of a laminated structure including multiple film layers.

Materials and thicknesses of the multiple film layers may be the same or may be different.

The first free layer 41 is designed as the laminated structure including the multiple film layers, so that a coercive force of the first free layer 41 can be reduced, and a magnetization direction of the first free layer 41 is reversed more easily.

Considering that a thickness design of the first free layer 41 affects a magnetization direction and a coercive force of the first free layer 41, in some embodiments, the thickness of the first free layer 41 is 2 to 40 nm. For example, the thickness of the first free layer 41 is 10 nm, 15 nm, 20 nm, 25 nm, 30 nm or 35 nm.

A material making up the first free layer 41 may be, for example, a ferromagnetic material (FM) having vertical magnetic anisotropy. Such a material that can be magnetized to a saturated state with a magnetic susceptibility greater than 0 under an action of only a very small magnetic field (where a value of the magnetic susceptibility is greater than the order of 10 to 10E6) and that maintains a magnetization state after the magnetic field action disappears (namely, a spontaneous magnetization phenomenon) is referred to as a ferromagnetic material.

In a possible embodiment, a material of each film layer of the first free layer 41 includes Co (cobalt), Mn (manganese), Si (silicon), Fe (ferro), B (boron), Al (aluminum), Ge (germanium), Te (tellurium), Cr (chromium), O (oxygen), Ni (nickel), Pt (platinum), or the like. For example, the material of each film layer of the first free layer 41 is Co2MnSi (cobalt manganese silicon), CoFeB (cobalt iron boron), Co2FeAl (cobalt iron aluminum), Fe3GeTe2 (iron germanium tellurium), CrGeTe3 (chromium germanium telluride), CrSiTe3 (chromium silicon telluride), CrTe2 (chromium ditelluride), Cr2Te3 (chromium telluride), CoFe (ferric cobalt), NiFe (ferric nickel), FePt (iron platinum), Fe3O4 (ferrosoferric oxide), Fe, Co, Pt, or the like.

A material making up the first tunneling layer 42 may be, for example, a metal oxide having a tunneling characteristic. In a possible embodiment, the material of the first tunneling layer 42 is an oxide of an element such as Mg (magnesium) and Al, or a combination of oxides of multiple elements. For example, the material of the first tunneling layer 42 is MgO (magnesium oxide), Al2O3 (aluminum oxide), MgAl2O4 (magnesium aluminum oxide), or the like.

A thickness of the first tunneling layer 42 only needs to be enough to form a tunneling barrier layer (or understood as having a quantum tunneling effect). If the first tunneling layer 42 is excessively thin, and a service life of the first tunneling layer is affected; or if the first tunneling layer 42 is excessively thick, a voltage written into the storage component is excessively high, and power consumption cannot be reduced.

In some embodiments, the thickness of the first tunneling layer 42 is 0.8 to 5 nm. For example, the thickness of the first tunneling layer 42 is 1 nm, 1.5 nm, 2 nm, 2.5 nm, 3 nm, 3.5 nm, 4 nm or 4.5 nm.

For the first fixed layer 43, reference may be made to the foregoing related description about the first free layer 41. Details are not described herein again. Certainly, it may be understood that, a coercive force of the first fixed layer 43 may be made to be greater than that of the first free layer 41 by adjusting a composition and a ratio of a film layer and a thickness of the film layer.

As shown in FIG. 3, the spin orbit coupling layer 20 and the first magnetic tunnel junction 40 are arranged in a stacked manner, and the spin orbit coupling layer 20 is located on one side that is of the first free layer 41 and that is away from the first tunneling layer 42.

With respect to a structure of the spin orbit coupling layer 20, to simplify a preparation process, in a possible embodiment, the spin orbit coupling layer 20 is of a single-layer film layer structure.

In another possible embodiment, the spin orbit coupling layer 20 is of a laminated structure including multiple film layers.

Materials of the multiple film layers may be the same or may be different.

The spin orbit coupling layer 20 is designed as the laminated structure including the multiple film layers, so that the spin orbit coupling layer 20 can form a stronger spin Hall effect, and a write current is reduced.

Considering that a thickness of the spin orbit coupling layer 20 affects efficiency of the spin orbit coupling layer 20 reverting magnetization directions of the first free layer 41 and a second free layer and growth quality of the spin orbit coupling layer 20 in a thin film growth process, in some embodiments, the thickness of the spin orbit coupling layer 20 is 2 to 30 nm. For example, the thickness of the spin orbit coupling layer 20 is 10 nm, 15 nm, 20 nm, or 25 nm.

A material making up the spin orbit coupling layer 20 may be, for example, a material having strong spin orbit coupling performance. In a possible embodiment, the material of the spin orbit coupling layer 20 includes Ta (tantalum), P (phosphorus), W (tungsten), Bi (bimuth), Te (tellurium), Se (selenium), Sb (monymony), Sr (strontium), Ir (irium), O, C (carbon), Zr (zirconium), or the like. For example, the material of the spin orbit coupling layer 20 is a heavy metal monomer, an oxide, graphene, or a topological insulator. For example, the material of the spin orbit coupling layer 20 is Ta, P, W, Bi2Te3 (bismuth telluride), Bi2Se3 (bismuth selenide), BiSbTeSe2 (BSTS), Sr2IrO4 (strontium iridate), ZrBi2 (zirconium bismuth), or the like.

In a possible embodiment, a structure of the second magnetic tunnel junction 50 is shown in FIG. 3. The second magnetic tunnel junction 50 includes a second free layer 51, a second tunneling layer 52, and a second fixed layer 53 that are sequentially arranged in a stacked manner.

As shown in FIG. 3, the second free layer 51 is arranged on the spin orbit coupling layer 20. In other words, the first free layer 41 and the second free layer 51 are arranged on two opposite surfaces of the spin orbit coupling layer 20.

A material and a structure of the second free layer 51 may be the same as those of the first free layer 41. Refer to the foregoing description about the first free layer 41. Details are not described herein again.

Similarly, a material and a structure of the second tunneling layer 52 may be the same as those of the first tunneling layer 42. Refer to the foregoing description about the first tunneling layer 42. Details are not described herein again.

Similarly, a material and a structure of the second fixed layer 53 may be the same as those of the first fixed layer 43. Refer to the foregoing descriptions about the first fixed layer 43. Details are not described herein again.

It should be noted that a thickness of the second free layer 51 may be the same as or different from that of the first free layer 41. A thickness of the second tunneling layer 52 may be the same as or different from that of the first tunneling layer 42. A thickness of the second fixed layer 53 may be the same as or different from that of the first fixed layer 43.

Performance (for example, a read/write time and read/write power consumption) of the storage component 100 may be adjusted by adjusting thicknesses of the film layers of the first magnetic tunnel junction 40, the second magnetic tunnel junction 50, and the spin orbit coupling layer 20.

Based on the storage component 100 shown in FIG. 3, a principle of the first magnetic tunnel junction 40 is the same as that of the second magnetic tunnel junction 50. The first magnetic tunnel junction 40 is used as an example. For the first magnetic tunnel junction 40, paralleling or anti-paralleling between a magnetization direction of the first free layer 41 and a magnetization direction of the first fixed layer 43 is adjusted based on a spin transfer torque (STT) effect.

In a magnetic tunnel junction, when a current flows from one magnetic layer (fixed layer) to another weaker magnetic layer (free layer), a spin angular momentum in a direction the same as a magnetization direction of the fixed layer is first obtained. When the spin polarization current diffuses into the free layer, the spin polarization current interacts with magnetization of the free layer, causing a transverse component of the spin polarization current to be transferred. Due to the angular momentum conservation, the transferred transverse component will act on the free layer in a form of a torque, which forces a magnetization direction of the free layer to be close to that of the fixed layer. This torque is called a spin transfer torque.

For the spin orbit coupling layer 20, reversing of magnetization directions of the first free layer 41 and the second free layer 51 is induced based on a spin orbit torque (SOT) effect.

A spin orbit torque means that: A spin flow generated by induction of a charge flow of the spin orbit coupling layer 20 is used to generate a spin transfer torque based on a spin orbit coupling effect, so as to induce reversing of a magnetization direction of a magnetic metal material of the free layer. Spin orbit coupling refers to the interaction of a particle's spin motion and its orbital motion in the quantum mechanical system.

According to the storage component 100 provided in this embodiment of this application, under a joint action of the first magnetic tunnel junction 40, the second magnetic tunnel junction 50, and the spin orbit coupling layer 20, resistive states of the first magnetic tunnel junction 40 and the second magnetic tunnel junction 50 are adjusted by adjusting magnetization directions of the first free layer 41 and the second free layer 51, so as to adjust a storage state corresponding to the storage component 100.

Figure 4A:
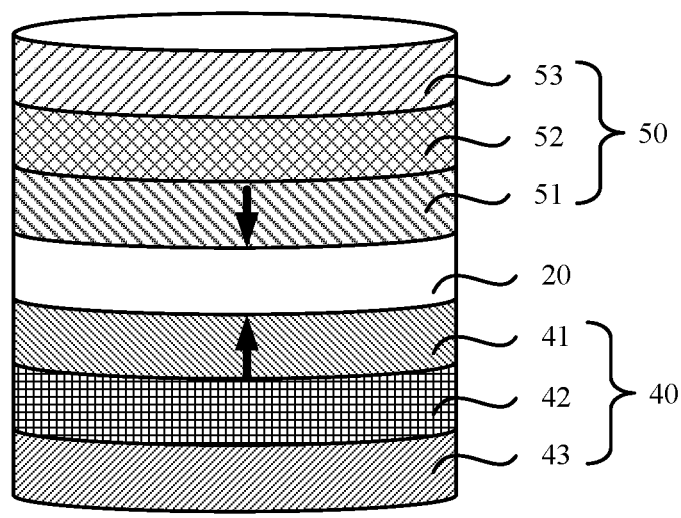
FIG. 4a is a diagram of a storage state of a storage component according to an embodiment of this application.

As shown in FIG. 4a, when the magnetization direction of the first free layer 41 is upward, and the magnetization direction of the second free layer 51 is downward, namely, when the magnetization direction of the first free layer 41 is opposite to that of the second free layer 51, a spin-down spin carrier in the spin orbit coupling layer 20 is bounced back because a spin direction of the spin-down spin carrier is opposite to the magnetization direction of the first free layer 41, and a spin-up spin carrier in the spin orbit coupling layer 20 is bounced back because the spin-up spin carrier is opposite to the magnetization direction of the second free layer 51. In other words, spin directions of the spin flow of the spin orbit coupling layer 20 may be opposite to both the magnetization direction of the first free layer 41 and the magnetization direction of the second free layer 51. In this way, an inverse spin Hall (ISH) effect is generated, all spin carriers are bounced back to the spin orbit coupling layer 20, and the spin orbit coupling layer 20 obtains an additional inverse spin Hall current Iish. This corresponds to a high current state of the storage component 100, namely, corresponds to a low resistive state of the storage component 100.

The inverse spin Hall effect refers to that a spin current that is reversed in a vertical direction is converted into a charge flow in a direction parallel to an existing current direction when no external magnetic field is applied, and a charge current characteristic is reflected in a macroscopic manner.

Figure 4B:
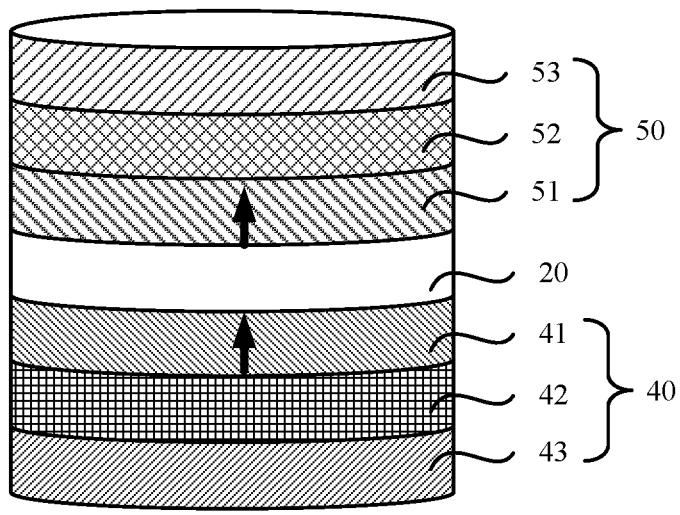
FIG. 4b is a diagram of a storage state of another storage component according to an embodiment of this application.

As shown in FIG. 4b, when the magnetization direction of the first free layer 41 is upward, and the magnetization direction of the second free layer 51 is also upward, namely, when the magnetization direction of the first free layer 41 is the same as that of the second free layer 51, a spin-down spin carrier in the spin orbit coupling layer 20 is bounced back because a spin direction of the spin-down spin carrier is opposite to the magnetization direction of the first free layer 41, and a spin-up spin carrier in the spin orbit coupling layer 20 diffuses into the second free layer 51 because the spin-up spin carrier is the same as that of the second free layer 51. In other words, spin directions of the spin flow of the spin orbit coupling layer 20 may be opposite to the magnetization direction of the first free layer 41 and the same as the magnetization direction of the second free layer 51. In this way, an inverse spin Hall effect is generated, half of spin carriers are bounced back to the spin orbit coupling layer 20, and the spin orbit coupling layer 20 obtains a relatively small additional current ½Iish. This corresponds to a medium current state of the storage component 100, namely, corresponds to a medium resistive state of the storage component 100.

Figure 4C:
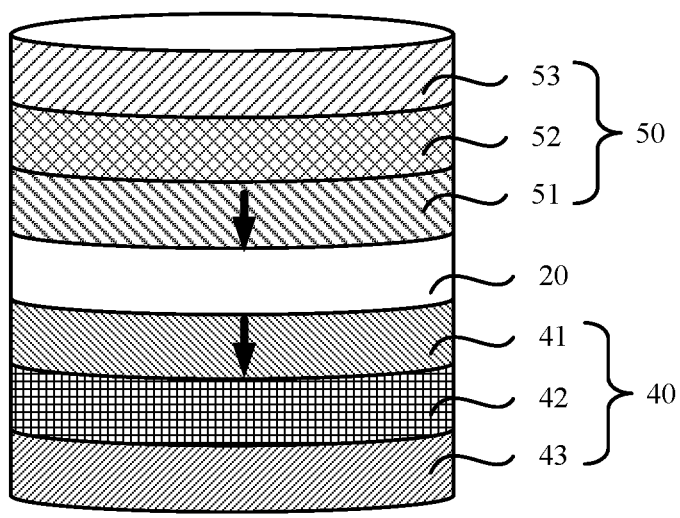
FIG. 4c is a diagram of a storage state of still another storage component according to an embodiment of this application.

As shown in FIG. 4c, when the magnetization direction of the first free layer 41 is downward, and the magnetization direction of the second free layer 51 is also downward, namely, when the magnetization direction of the first free layer 41 is the same as that of the second free layer 51, a spin-up spin carrier in the spin orbit coupling layer 20 is bounced back because the spin-up spin carrier is opposite to the magnetization direction of the second free layer 51, a spin-down spin carrier in the spin orbit coupling layer 20 diffuses into the first free layer 41 because the spin-down spin carrier is the same as the magnetization direction of the first free layer 41. In other words, spin directions of the spin flow of the spin orbit coupling layer 20 may be the same as the magnetization direction of the first free layer 41 and opposite to the magnetization direction of the second free layer 51. In this way, an inverse spin Hall effect is generated, half of spin carriers are bounced back to the spin orbit coupling layer 20, and the spin orbit coupling layer 20 obtains a relatively small additional current ½Iish. This corresponds to a medium current state of the storage component 100, namely, corresponds to a medium resistive state of the storage component 100.

For ease of description, the following describes the medium resistive state of the storage component 100 by using only an example shown in FIG. 4b in which the magnetization direction of the first free layer 41 is upward and the magnetization direction of the second free layer 51 is also upward.

Figure 4D:
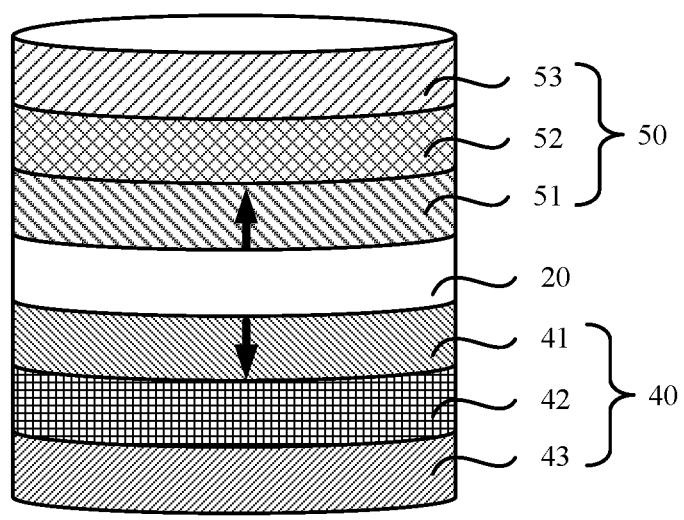
FIG. 4d is a diagram of a storage state of yet another storage component according to an embodiment of this application.

As shown in FIG. 4d, when the magnetization direction of the first free layer 41 is downward, and the magnetization direction of the second free layer 51 is upward, namely, when the magnetization direction of the first free layer 41 is opposite to that of the second free layer 51, a spin-down spin carrier in the spin orbit coupling layer 20 diffuses into the first free layer 41 because the spin-down spin carrier is the same as the magnetization direction of the first free layer 41, and a spin-up spin carrier in the spin orbit coupling layer 20 diffuses into the second free layer 51 because the spin-up spin carrier is the same as the magnetization direction of the second free layer 51. In other words, spin directions of the spin flow of the spin orbit coupling layer 20 may be the same as both the magnetization direction of the first free layer 41 and the magnetization direction of the second free layer 51. In this way, no inverse spin Hall effect is generated. This corresponds to a low current state of the storage component 100, namely, corresponds to a high resistive state of the storage component 100.

Based on this, the storage component 100 provided in this embodiment of this application has three storage states: the low resistive state, the medium resistive state, and the high resistive state. However, for a conventional storage component, when a magnetization direction of a fixed layer is parallel to that of a free layer, the storage component is in a low resistive state, and when a magnetization direction of the fixed layer is antiparallel to that of the free layer, the storage component is in a high resistive state. There are only two storage states. Therefore, according to the storage component 100 provided in this embodiment of this application, a quantity of storage states can be increased, multi-state storage can be implemented, and a storage density of the storage component 100 can be improved.

Figure 5A:
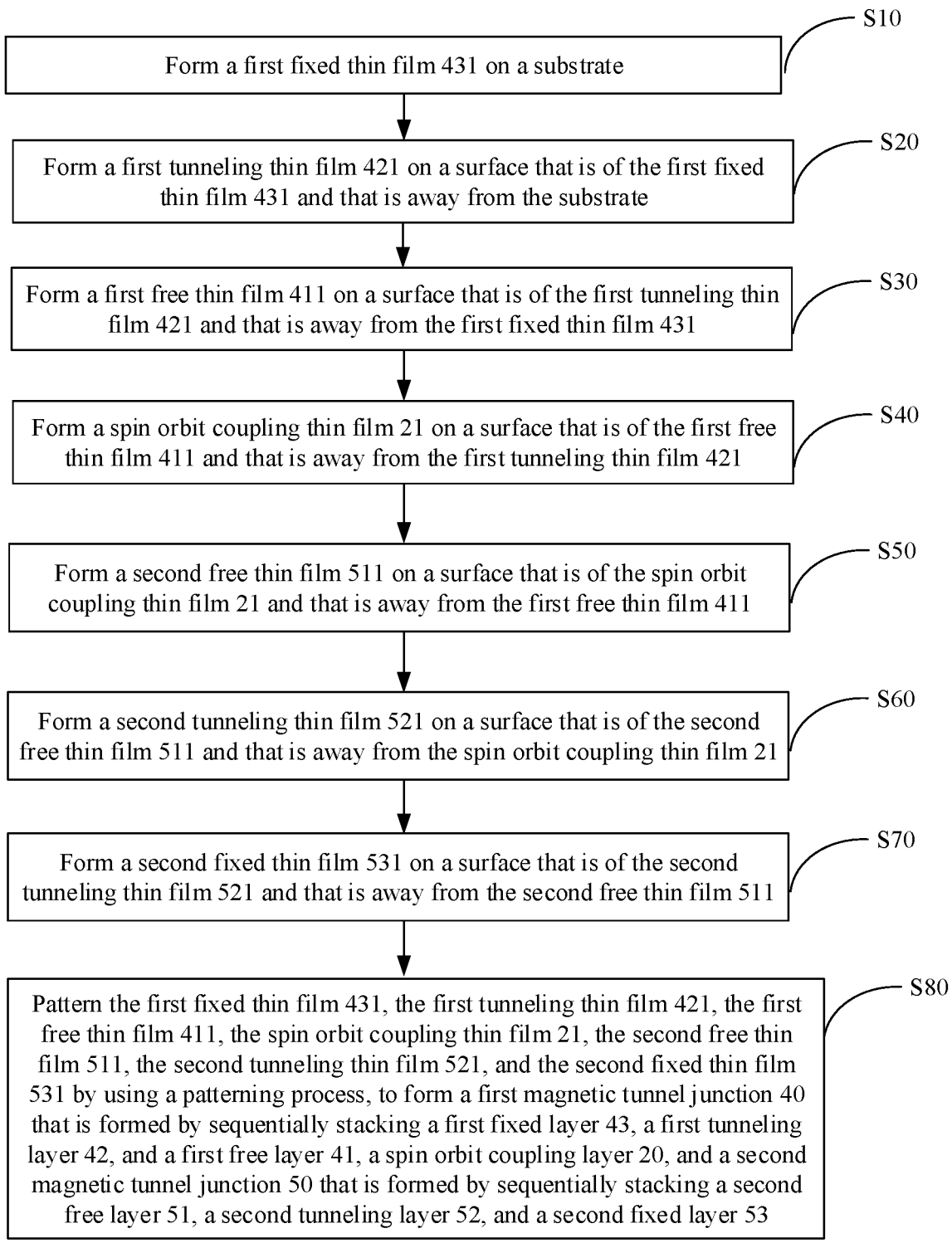
FIG. 5a is a flowchart of a preparation method of a storage component according to an embodiment of this application.

For a method for forming the first magnetic tunnel junction 40, the spin orbit coupling layer 20, and the second magnetic tunnel junction 50 that are sequentially arranged in a stacked manner and that are shown in FIG. 3, in a possible embodiment, as shown in FIG. 5a, a method for preparing a storage component 100 includes the following operations.

Figure 1:
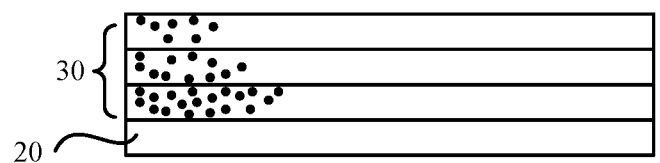
FIG. 1 is a diagram of a structure of a storage component according to a related technology.
Figures 1, 5B:
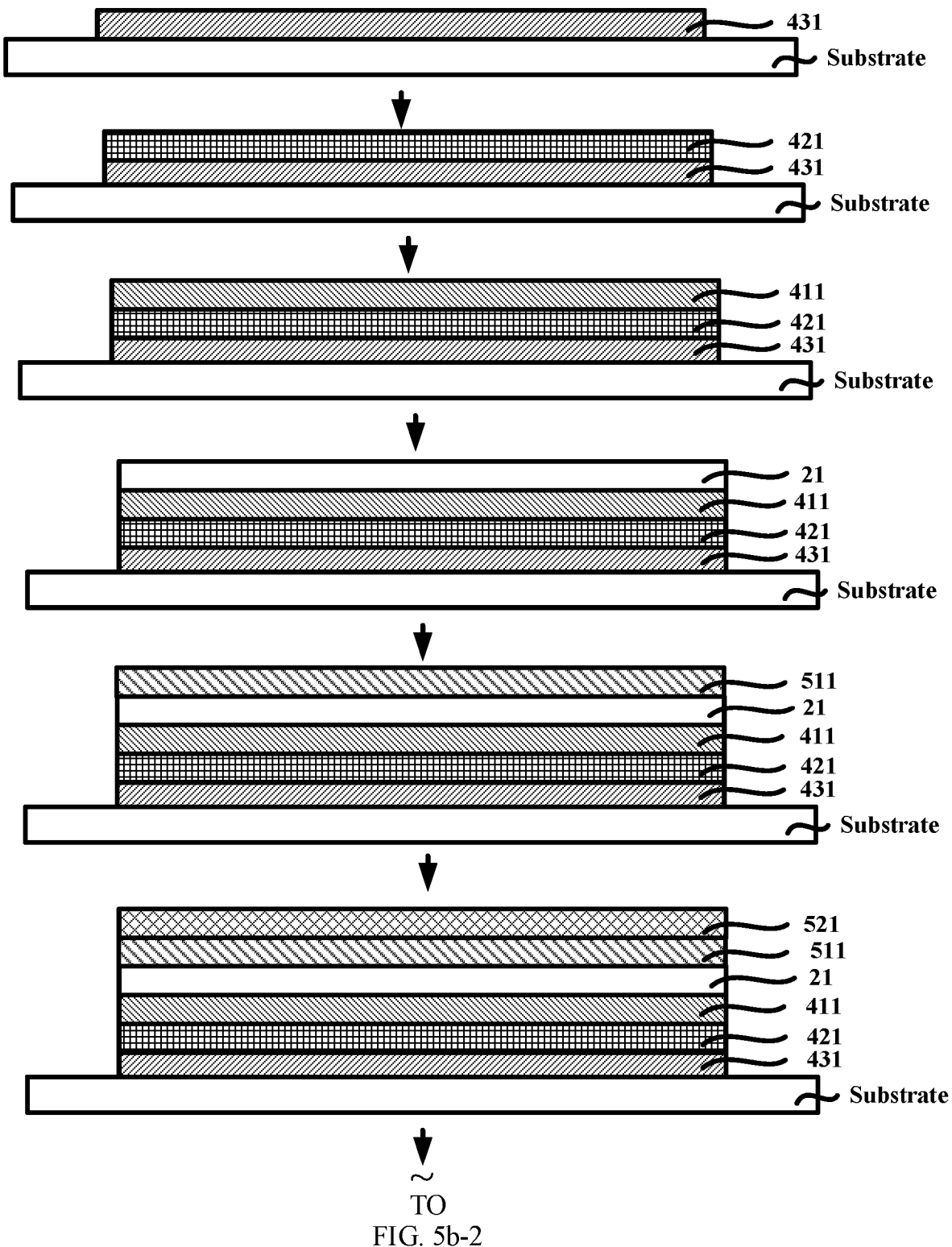
Figures 2, 5B:
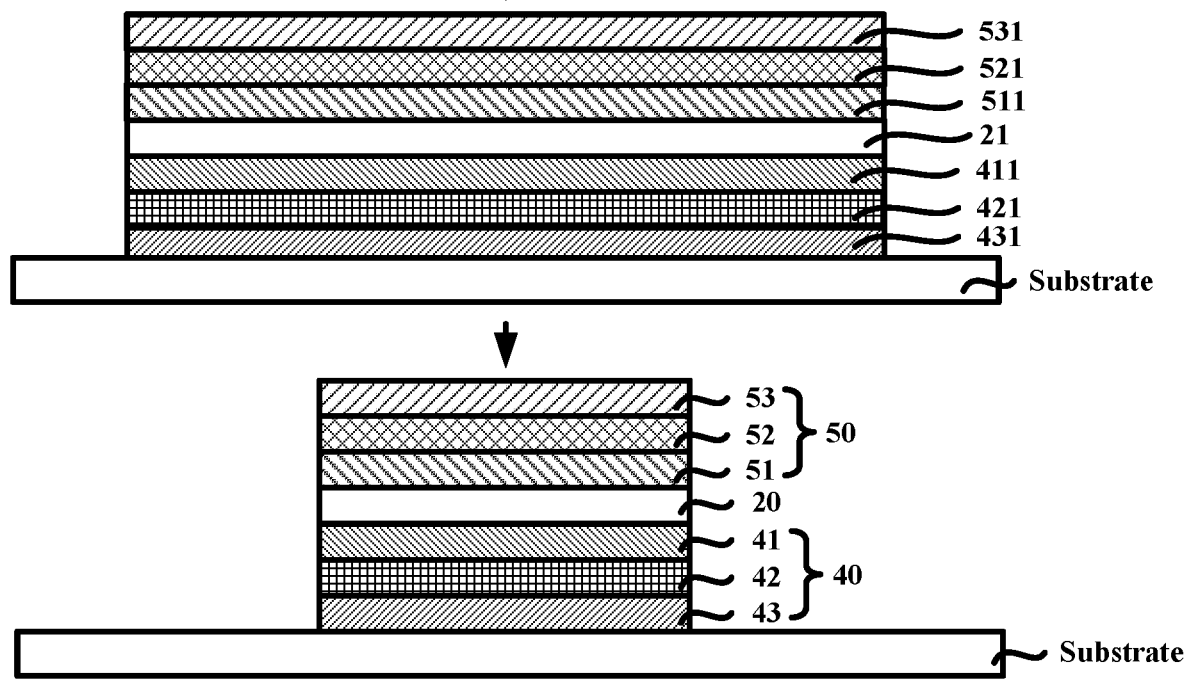

S10: As shown in FIG. 5b-1, form a first fixed thin film 431 on a substrate.

The substrate may be a glass substrate, or may be a Si or SiO2 (silicon oxide) substrate.

For example, the first fixed thin film 431 may be formed by using a magnetron sputtering process, a chemical meteorological deposition process, an electron beam evaporation process, a thermal evaporation process, or the like.

A thickness of the first fixed thin film 431 may be, for example, 2 to 10 nm. A material of the first fixed thin film 431 may be, for example, CoFeB.

S20: As shown in FIG. 5b-1, form a first tunneling thin film 421 on a surface that is of the first fixed thin film 431 and that is away from the substrate.

Similarly, the first tunneling thin film 421 may be formed by using the magnetron sputtering process, the chemical meteorological deposition process, the electron beam evaporation process, the thermal evaporation process, or the like.

A thickness of the first tunneling thin film 421 may be, for example, 0.8 to 5 nm. A material of the first tunneling thin film 421 may be, for example, MgO.

S30: As shown in FIG. 5b-1, form a first free thin film 411 on a surface that is of the first tunneling thin film 421 and that is away from the first fixed thin film 431.

Similarly, the first free thin film 411 may be formed by using the magnetron sputtering process, the chemical meteorological deposition process, the electron beam evaporation process, the thermal evaporation process, or the like.

A thickness of the first free thin film 411 may be, for example, 2 to 10 nm. A material of the first free thin film 411 may be, for example, CoFeB.

S40: As shown in FIG. 5b-1, form a spin orbit coupling thin film 21 on a surface that is of the first free thin film 411 and that is away from the first tunneling thin film 421.

Similarly, the spin orbit coupling thin film 21 may be formed by using the magnetron sputtering process, the chemical meteorological deposition process, the electron beam evaporation process, the thermal evaporation process, or the like.

A thickness of the spin orbit coupling thin film 21 may be, for example, 2 to 20 nm. A material of the spin orbit coupling thin film 21 may be, for example, Ta.

S50: As shown in FIG. 5b-1, form a second free thin film 511 on a surface that is of the spin orbit coupling thin film 21 and that is away from the first free thin film 411.

Similarly, the second free thin film 511 may be formed by using the magnetron sputtering process, the chemical meteorological deposition process, the electron beam evaporation process, the thermal evaporation process, or the like.

A thickness of the second free thin film 511 may be, for example, 2 to 10 nm. A material of the second free thin film 511 may be, for example, CoFeB.

S60: As shown in FIG. 5b-1, form a second tunneling thin film 521 on a surface that is of the second free thin film 511 and that is away from the spin orbit coupling thin film 21.

Similarly, the second tunneling thin film 521 may be formed by using the magnetron sputtering process, the chemical meteorological deposition process, the electron beam evaporation process, the thermal evaporation process, or the like.

A thickness of the second tunneling thin film 521 may be, for example, 0.8 to 5 nm. A material of the second tunneling thin film 521 may be, for example, MgO.

S70: As shown in FIG. 5b-2, form a second fixed thin film 531 on a surface that is of the second tunneling thin film 521 and that is away from the second free thin film 511.

Similarly, the second fixed thin film 531 may be formed by using the magnetron sputtering process, the chemical meteorological deposition process, the electron beam evaporation process, the thermal evaporation process, or the like.

A thickness of the second fixed thin film 531 may be, for example, 2 to 10 nm. A material of the second fixed thin film 531 may be, for example, CoFeB.

S80: As shown in FIG. 5b-2, pattern the first fixed thin film 431, the first tunneling thin film 421, the first free thin film 411, the spin orbit coupling thin film 21, the second free thin film 511, the second tunneling thin film 521, and the second fixed thin film 531 by using a patterning process, to form the first magnetic tunnel junction 40 that is formed by sequentially stacking a first fixed layer 43, a first tunneling layer 42, and a first free layer 41, the spin orbit coupling layer 20, and the second magnetic tunnel junction 50 that is formed by sequentially stacking a second free layer 51, a second tunneling layer 52, and a second fixed layer 53.

The patterning process may be, for example, a composition process (which may include a process such as exposure, image development, and etching). In this embodiment of this application, the first fixed thin film 431, the first tunneling thin film 421, the first free thin film 411, the spin orbit coupling thin film 21, the second free thin film 511, the second tunneling thin film 521, and the second fixed thin film 531 are first formed, and then the foregoing film layers are patterned by using the patterning process, to form the first magnetic tunnel junction 40, the spin orbit coupling layer 20, and the second magnetic tunnel junction 50. The process is mature. No related doping process is required, the process is simple, and preparation efficiency is high.

In addition, the first magnetic tunnel junction 40, the spin orbit coupling layer 20, and the second magnetic tunnel junction 50 that are obtained by means of preparation have equal sizes, so that an area occupied by the storage component 100 can be reduced.

Figure 6A:
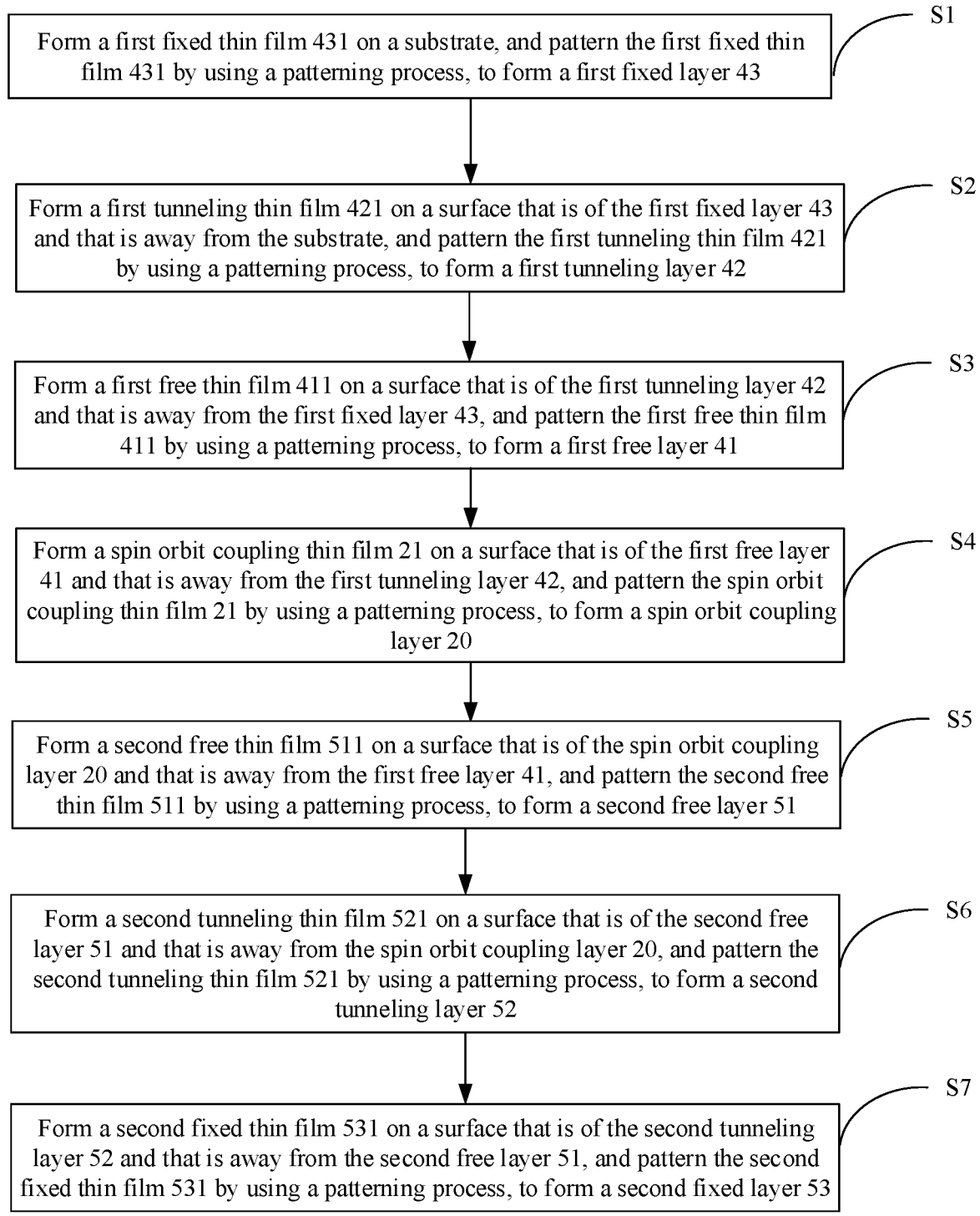
FIG. 6a is a flowchart of another preparation method of a storage component according to an embodiment of this application.

For a method for forming the first magnetic tunnel junction 40, the spin orbit coupling layer 20, and the second magnetic tunnel junction 50 that are sequentially arranged in a stacked manner and that are shown in FIG. 3, in another possible embodiment, as shown in FIG. 6a, a preparation method of a storage component 100 includes the following operations.

Figures 1, 6B:
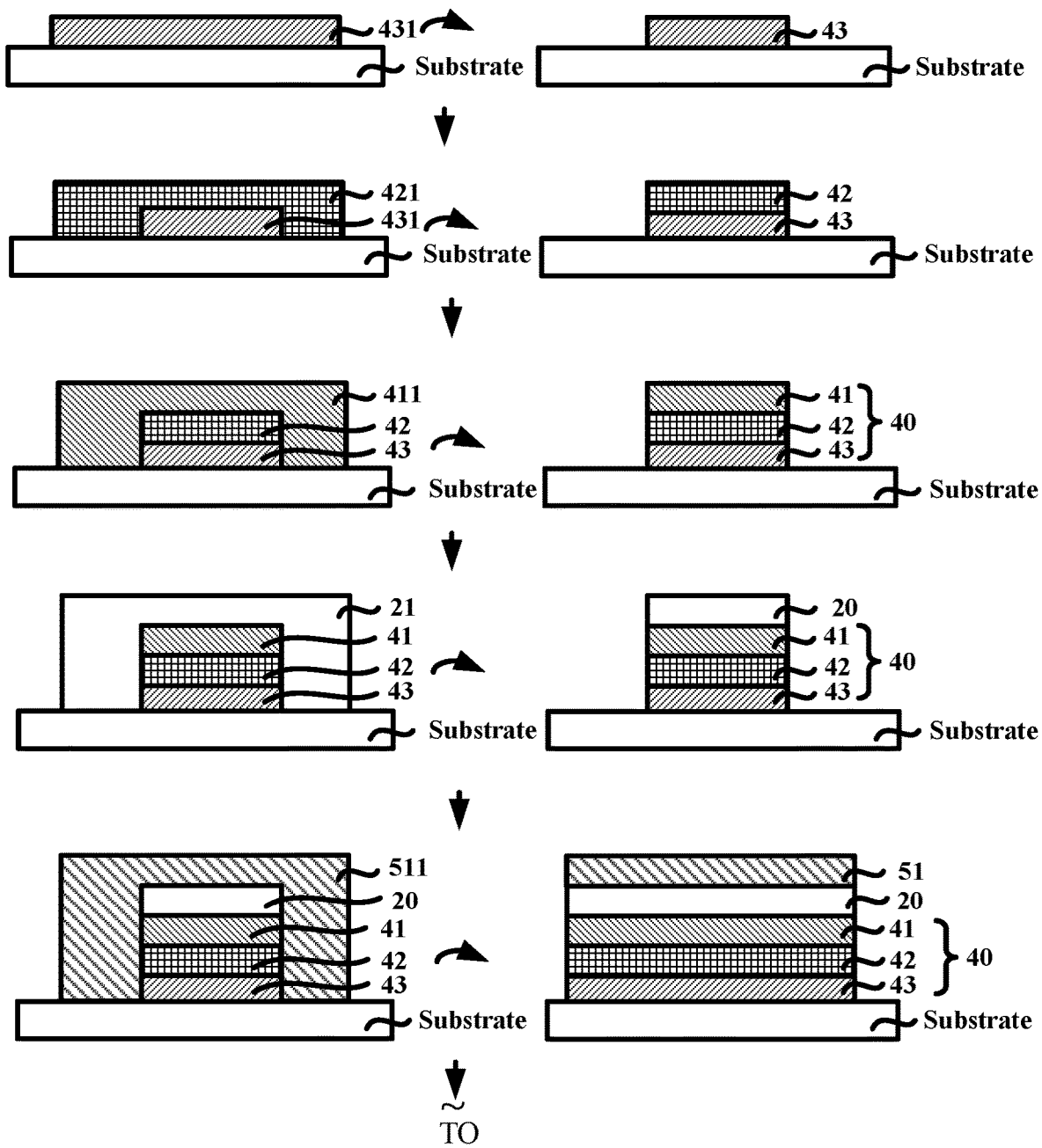
Figures 2, 6B:
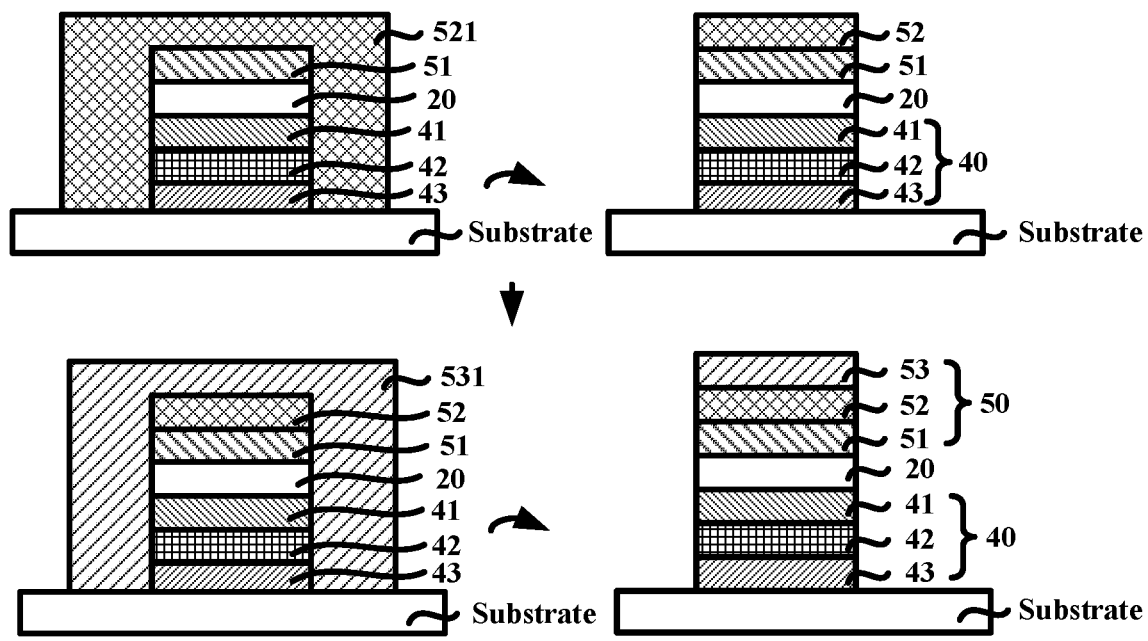

S1: As shown in FIG. 6b, form a first fixed thin film 431 on a substrate, and pattern the first fixed thin film 431 by using a patterning process, to form a first fixed layer 43.

S2: As shown in FIG. 6b, form a first tunneling thin film 421 on a surface that is of the first fixed layer 43 and that is away from the substrate, and pattern the first tunneling thin film 421 by using a patterning process, to form a first tunneling layer 42.

S3: As shown in FIG. 5b, form a first free thin film 411 on a surface that is of the first tunneling layer 42 and that is away from the first fixed layer 43, and pattern the first free thin film 411 by using a patterning process, to form a first free layer 41.

The first fixed layer 43, the first tunneling layer 42, and the first free layer 41 that are arranged in a stacked manner constitute the first magnetic tunnel junction 40.

S4: As shown in FIG. 6b-1, form a spin orbit coupling thin film 21 on a surface that is of the first free layer 41 and that is away from the first tunneling layer 42, and pattern the spin orbit coupling thin film 21 by using a patterning process, to form a spin orbit coupling layer 20.

S5: As shown in FIG. 6b-1, form a second free thin film 511 on a surface that is of the spin orbit coupling layer 20 and that is away from the first free layer 41, and pattern the second free thin film 511 by using a patterning process, to form a second free layer 51.

S6: As shown in FIG. 6b-2, form a second tunneling thin film 521 on a surface that is of the second free layer 51 and that is away from the spin orbit coupling layer 20, and pattern the second tunneling thin film 521 by using a patterning process, to form a second tunneling layer 52.

S7: As shown in FIG. 6b-2, form a second fixed thin film 531 on a surface that is of the second tunneling layer 52 and that is away from the second free layer 51, and pattern the second fixed thin film 531 by using a patterning process, to form a second fixed layer 53.

The second fixed layer 53, the second tunneling layer 52, and the second free layer 51 that are arranged in a stacked manner constitute the second magnetic tunnel junction 50.

For a forming process, a material, and a thickness of each film layer in FIG. 6b-1 and FIG. 6b-2, reference may be made to the foregoing description about FIG. 5b-1 and FIG. 5b-2. Details are not described herein again.

In this embodiment of this application, the foregoing storage component 100 is formed by using a film forming process and the patterning process, and the process is mature. No related doping process is required, the process is simple, and the preparation efficiency is high.

In a possible embodiment, a structure of the first magnetic tunnel junction 40 is the same as that of the second magnetic tunnel junction 50.

It may be understood that, that the structure of the first magnetic tunnel junction 40 is the same as that of the second magnetic tunnel junction 50 means that: The first free layer 41 in the first magnetic tunnel junction 40 and the second free layer 51 in the second magnetic tunnel junction 50 have a same material, thickness, and the like; the first tunneling layer 42 in the first magnetic tunnel junction 40 and the second tunneling layer 52 in the second magnetic tunnel junction 50 have a same material, thickness, and the like; and the first fixed layer 43 in the first magnetic tunnel junction 40 and the second fixed layer 53 in the second magnetic tunnel junction 50 have a same material, thickness, and the like. In other words, a resistance of the first magnetic tunnel junction 40 is equal to that of the second magnetic tunnel junction 50.

In this way, the first magnetic tunnel junction 40 and the second magnetic tunnel junction 50 may be prepared by using a same process, and the preparation process may be simplified.

Figure 7A:
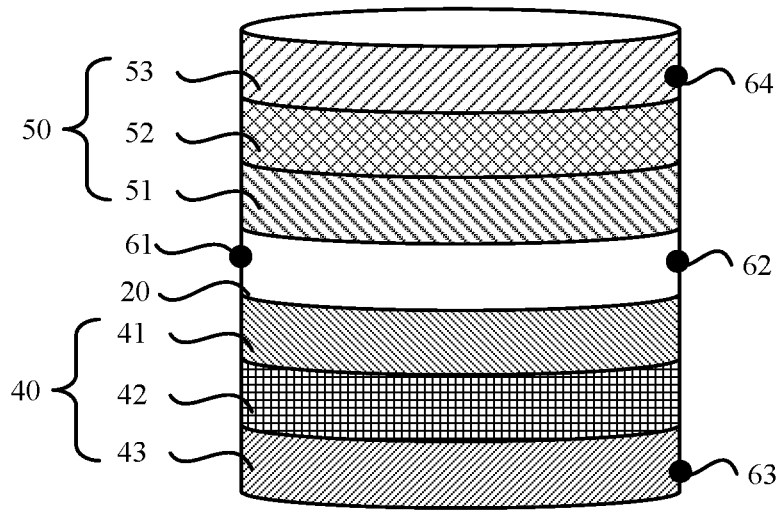
FIG. 7a is a diagram of a structure of another storage component according to an embodiment of this application.

Based on the structure shown in FIG. 3, in a possible embodiment, as shown in FIG. 7a, the storage component 100 further includes a first electrode 61 and a second electrode 62. The first electrode 61 and the second electrode 62 are coupled to two opposite sides of the spin orbit coupling layer 20.

Materials and structures of the first electrode 61 and the second electrode 62 are not limited, as long as an electrical signal can be transmitted to the spin orbit coupling layer 20.

In a possible embodiment, as shown in FIG. 7a, the storage component 100 further includes a third electrode 63 and a fourth electrode 64. The third electrode 63 is coupled to the first fixed layer 43 of the first magnetic tunnel junction 40, and the fourth electrode 64 is coupled to the second fixed layer 53 of the second magnetic tunnel junction 50.

Figure 7B:
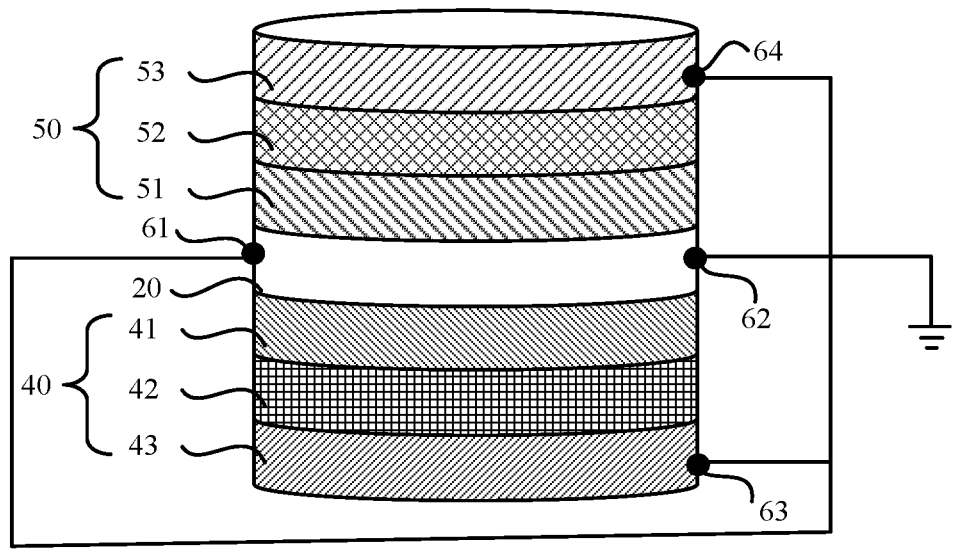
FIG. 7b is a diagram of a structure of still another storage component according to an embodiment of this application.

In a possible embodiment, as shown in FIG. 7b, the second electrode 62, the third electrode 63, and the fourth electrode 64 are separately coupled to a reference ground end.

The following describes, by using several detailed embodiments, a reading/writing method of the storage component 100 provided in this embodiment of this application.

Embodiment 1

Figure 8:
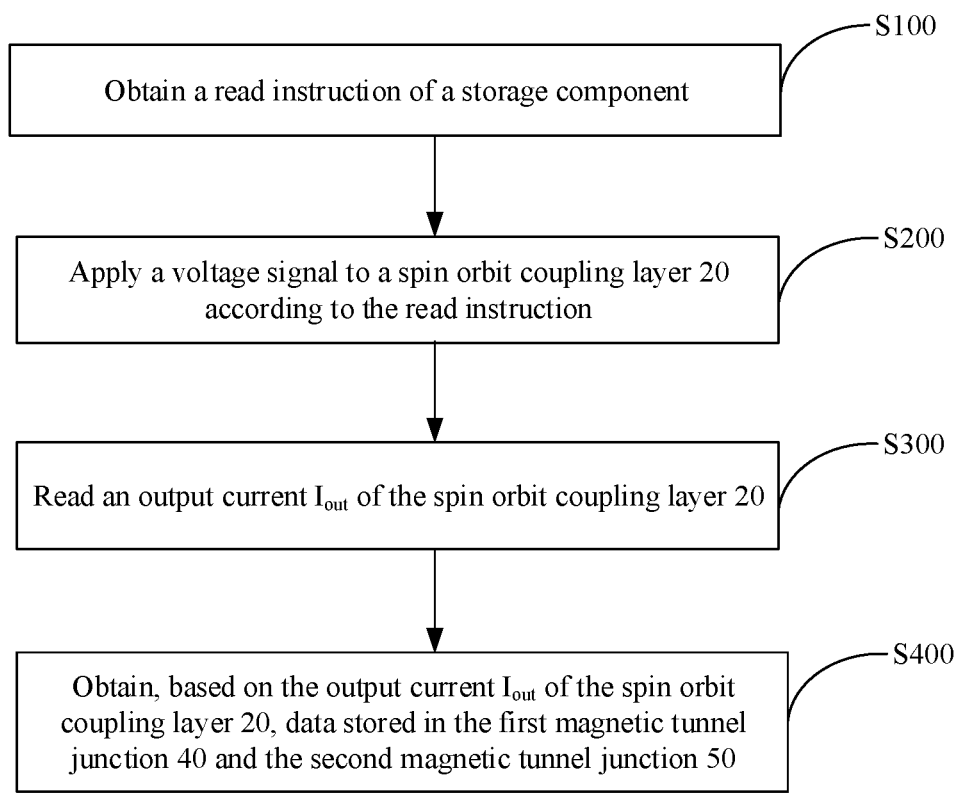
FIG. 8 is a flowchart of a reading method of a storage component according to an embodiment of this application.

As shown in FIG. 8, a reading method of a storage component 100 in this embodiment of this application includes the following operations.

S100: Obtain a read instruction of a storage component.

The read instruction refers to a machine instruction obtained by a control circuit that is in a storage chip and that is connected to the storage component 100. For example, the read instruction includes an instruction corresponding to character display, picture display, audio and video playing, application program running, and the like. A manner of obtaining the read instruction includes performing an action, such as a mouse click, a finger tap, or a physical button press, on the corresponding instruction.

S200: Apply a voltage signal to a spin orbit coupling layer 20 according to the read instruction.

In other words, the voltage signal is applied to a first electrode 61 according to the read instruction. After the voltage signal enters the spin orbit coupling layer 20, an in-plane current Iin is formed in the spin orbit coupling layer 20.

S300: Read an output current Iout of the spin orbit coupling layer 20.

After the in-plane current Iin is formed in the spin orbit coupling layer 20, a spin current is generated under an action of a spin Hall effect (SHE). Whether a spin carrier in the spin current generates an inverse spin Hall current Iish due to an inverse spin Hall effect is related to a magnetization direction of a first free layer 41 in a first magnetic tunnel junction 40 and a magnetization direction of a second free layer 51 in a second magnetic tunnel junction 50. In other words, a magnitude of the output current Iout of the spin orbit coupling layer 20 is related to the magnetization direction of the first free layer 41 in the first magnetic tunnel junction 40 and the magnetization direction of the second free layer 51 in the second magnetic tunnel junction 50.

The spin Hall effect refers to the rotation of electrons in different spin directions in a direction perpendicular to a current when no external magnetic field is applied. Therefore, a spin current in a vertical direction is generated.

For example, the output current Iout of the spin orbit coupling layer 20 is read on the first electrode 61 and a second electrode 62 that are located on two sides of the spin orbit coupling layer 20.

S400: Obtain, based on the output current Iout of the spin orbit coupling layer 20, data stored in the first magnetic tunnel junction 40 and the second magnetic tunnel junction 50.

The magnitude of the output current Iout of the spin orbit coupling layer 20 varies with the magnetization direction of the first free layer 41 in the first magnetic tunnel junction 40 and the magnetization direction of the second free layer 51 in the second magnetic tunnel junction 50. Each resistive state has a magnetization direction of the first free layer 41 and a magnetization direction of the second free layer 51 that are corresponding to the resistive state.

Therefore, the magnetization direction of the first free layer 41 and the magnetization direction of the second free layer 51 may be determined by detecting the output current Iout of the spin orbit coupling layer 20, so as to determine which resistive state of a high resistive state, a medium resistive state, and a low resistive state the storage component 100 is in, so that the data stored in the first magnetic tunnel junction 40 and the second magnetic tunnel junction 50 is obtained.

In a possible embodiment, operation S400 includes the following operations.

The low resistive state is read when Iout=Iin+Iish.

Figure 9A:
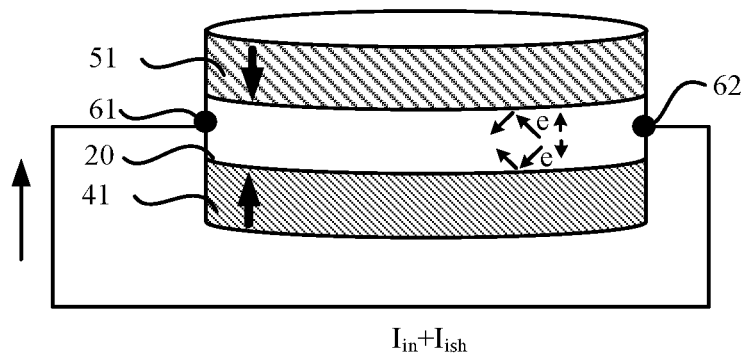
FIG. 9a is a diagram of a reading principle of a storage component according to an embodiment of this application.

After the voltage signal enters the spin orbit coupling layer 20, an in-plane current Iin is formed in the spin orbit coupling layer 20. When Iout=Iin+Iish, it indicates that an inverse spin Hall effect is generated in the spin orbit coupling layer 20, and an additional inverse spin Hall current Iish is formed. In other words, as shown in FIG. 9a, spin directions of a spin flow of the spin orbit coupling layer 20 are opposite to both the magnetization direction of the first free layer 41 and the magnetization direction of the second free layer 51. A spin-down spin carrier in the spin orbit coupling layer 20 is bounced back at an interface between the first free layer 41 and the spin orbit coupling layer 20 because a spin direction of the spin-down spin carrier is opposite to the magnetization direction of the first free layer 41. A spin-up spin carrier in the spin orbit coupling layer 20 is bounced back at an interface between the second free layer 51 and the spin orbit coupling layer 20 because the spin-up spin carrier is opposite to the magnetization direction of the second free layer 51. In this case, the storage component 100 is in the low resistive state shown in FIG. 4a, so that the low resistive state is read.

The medium resistive state is read when Iout=Iin+½Iish.

Figure 9B:
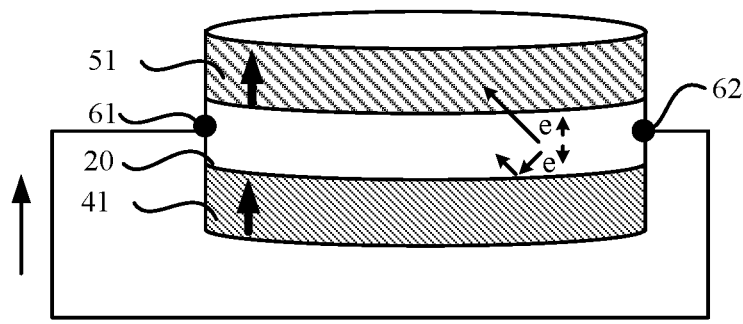
FIG. 9b is a diagram of another reading principle of a storage component according to an embodiment of this application.

After the voltage signal enters the spin orbit coupling layer 20, an in-plane current Iin is formed in the spin orbit coupling layer 20. When Iout=Iin+½Iish, it indicates that an inverse spin Hall effect is generated in the spin orbit coupling layer 20, and a relatively small additional current ½Iish is formed. In other words, as shown in FIG. 9b, spin directions of a spin flow of the spin orbit coupling layer 20 are opposite to the magnetization direction of the first free layer 41 and the same as the magnetization direction of the second free layer 51. A spin-down spin carrier in the spin orbit coupling layer 20 is bounced back at an interface between the first free layer 41 and the spin orbit coupling layer 20 because a spin direction of the spin-down spin carrier is opposite to the magnetization direction of the first free layer 41. A spin-up spin carrier in the spin orbit coupling layer 20 diffuses into the second free layer 51 because the spin-up spin carrier is the same as the magnetization direction of the second free layer 51. In this case, the storage component 100 is in the medium resistive state shown in FIG. 4b, so that the medium resistive state is read.

The high resistive state is read when Iout=Iin.

Figure 9C:
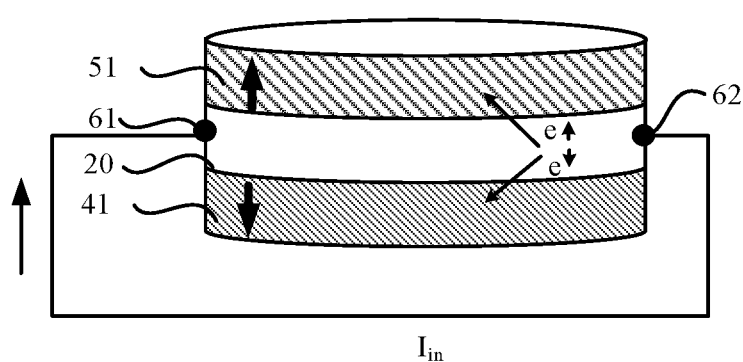
FIG. 9c is a diagram of still another reading principle of a storage component according to an embodiment of this application.

After the voltage signal enters the spin orbit coupling layer 20, an in-plane current Iin is formed in the spin orbit coupling layer 20. When Iout=Iin, it indicates that no inverse spin Hall effect is generated in the spin orbit coupling layer 20, and no inverse spin Hall current Iish is formed. In other words, as shown in FIG. 9c, spin directions of a spin flow of the spin orbit coupling layer 20 are the same as both the magnetization direction of the first free layer 41 and the magnetization direction of the second free layer 51. A spin-down spin carrier in the spin orbit coupling layer 20 diffuses into the first free layer 41 because the spin-down spin carrier is the same as the magnetization direction of the first free layer 41, and a spin-up spin carrier in the spin orbit coupling layer 20 diffuses into the second free layer 51 because the spin-up spin carrier is the same as the magnetization direction of the second free layer 51. In this case, the storage component 100 is in the high resistive state shown in FIG. 4*d*, so that the high resistive state is read.

For example, the low resistive state may be marked as 0 in a computer machine language, the medium resistive state may be marked as 1 in the computer machine language, and the high resistive state may be marked as 2 in the computer machine language, so as to correspond to ternary "0", "1", and "2" in the computer machine language. The language "0", "1", and "2" corresponding to an output current Iout is read from the storage component 100, and then a read operation of the storage component 100 is completed. Certainly, this is merely an example, and no limitation is imposed herein.

Embodiment 2

Figure 10:
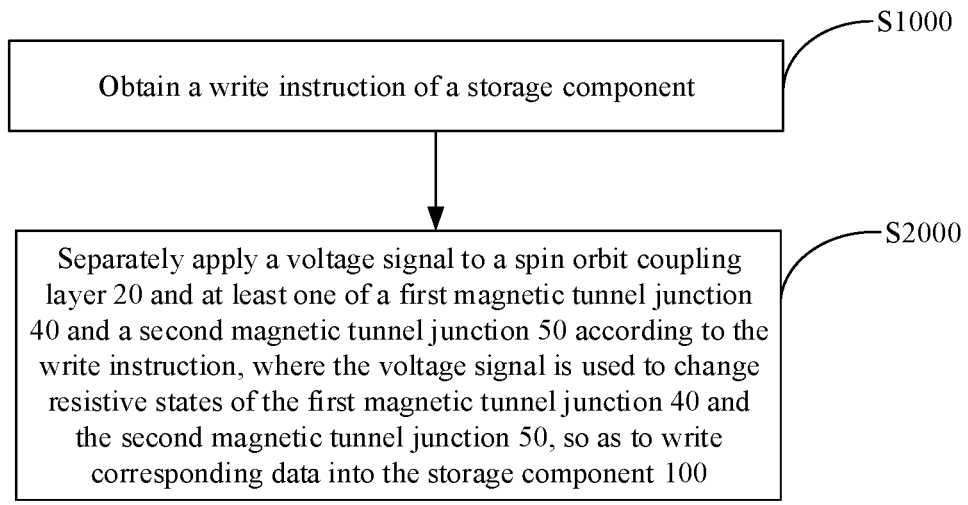
FIG. 10 is a flowchart of a writing method of a storage component according to an embodiment of this application.

As shown in FIG. 10, a writing method of a storage component 100 in this embodiment of this application includes the following operations.

S1000: Obtain a write instruction of a storage component.

The write instruction refers to a machine instruction obtained by a control circuit connected to the storage component 100. For example, the write instruction includes an instruction corresponding to typing a character, pasting a picture, downloading an application program, and the like. For example, a manner of obtaining the write instruction includes writing the corresponding instruction by using a keyboard, clicking the corresponding instruction by using a mouse, tapping the corresponding instruction by using a finger, or the like. This is not limited in this embodiment.

S2000: Separately apply a voltage signal to a spin orbit coupling layer 20 and at least one of a first magnetic tunnel junction 40 and a second magnetic tunnel junction 50 according to the write instruction, where the voltage signal is used to change resistive states of the first magnetic tunnel junction 40 and the second magnetic tunnel junction 50, so as to write corresponding data into the storage component 100.

In some embodiments, operation S2000 includes: Separately apply the voltage signal to the first magnetic tunnel junction 40 and the spin orbit coupling layer 20.

The voltage signal is used to change the resistive state of the first magnetic tunnel junction 40, so as to change a resistive state of the storage component 100, and write, into the storage component 100, data corresponding to the resistive state of the storage component 100.

The voltage signal is applied to the spin orbit coupling layer 20, and an in-plane current Iin is generated in the spin orbit coupling layer 20, so that a spin orbit torque is generated. The voltage signal is applied to a third electrode 63 of the first magnetic tunnel junction 40, and a current flowing from a first fixed layer 43 to a first free layer 41 is formed in the first magnetic tunnel junction 40, so that a spin transfer torque is generated in the first magnetic tunnel junction 40. A magnetization direction of the first free layer 41 is controlled to reverse under a joint action of a spin orbit torque effect and a spin transfer torque effect.

Depending on a requirement, a direction of the spin orbit torque of the spin orbit coupling layer 20 may be adjusted by adjusting a positive voltage signal or a negative voltage signal applied to the spin orbit coupling layer 20. A direction of the spin transfer torque may be adjusted by adjusting a positive voltage signal or a negative voltage signal applied to the third electrode 63. In this way, the magnetization direction of the first free layer 41 is controlled to reverse to facing away from the spin orbit coupling layer 20 or facing toward the spin orbit coupling layer 20. In this way, the resistive state of the first magnetic tunnel junction 40 is changed, so that the resistive state of the storage component 100 is changed, and data corresponding to the resistive state of the storage component 100 is written into the storage component 100.

Figure 11A:
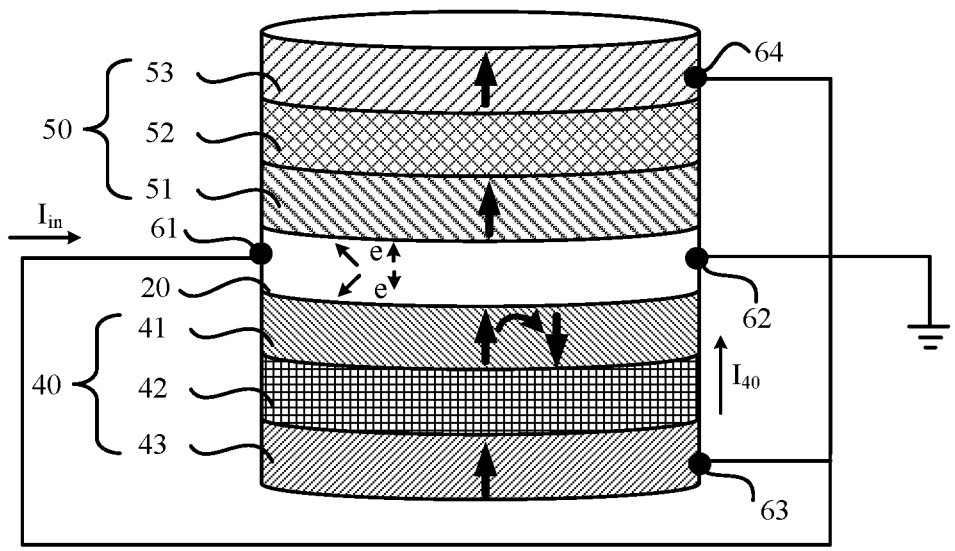
FIG. 11a is a diagram of a writing principle of a storage component according to an embodiment of this application.

In some embodiments, as shown in FIG. 11*a*, according to the write instruction, a positive voltage signal is applied to the spin orbit coupling layer 20, and a positive voltage signal is applied to the first magnetic tunnel junction 40. In this way, under an action of a spin orbit torque effect of the spin orbit coupling layer 20 and a spin transfer torque effect of the first magnetic tunnel junction 40, the magnetization direction of the first free layer 41 is reversed to facing away from the spin orbit coupling layer 20, the first magnetic tunnel junction 40 changes to be in a high resistive state, the storage component 100 changes to be in a high resistive state from a medium resistive state, and data corresponding to the high resistive state is written into the storage component 100.

When data corresponding to the high resistive state needs to be written, as shown in FIG. 4*d*, both the magnetization direction of the first free layer 41 and the magnetization direction of the second free layer 51 need to be facing away from the spin orbit coupling layer 20. When a current storage state of the storage component 100 is the medium resistive state, as shown in FIG. 4*b*, the magnetization direction of the first free layer 41 is facing toward the spin orbit coupling layer 20, and the magnetization direction of the second free layer 51 is facing away from the spin orbit coupling layer 20. Therefore, the magnetization direction of the first free layer 41 needs to be reversed from facing toward the spin orbit coupling layer 20 to facing away from the spin orbit coupling layer 20.

On this basis, as shown in FIG. 11*a*, the positive voltage signal is applied to the spin orbit coupling layer 20, a positive in-plane current Iin is generated in the spin orbit coupling layer 20, and a spin orbit torque facing away from the spin orbit coupling layer 20 is generated. The positive voltage signal is applied to the first magnetic tunnel junction 40, a positive first spin polarization current I40 is generated in the first magnetic tunnel junction 40, and a spin transfer torque in a direction antiparallel to the magnetization direction of the first fixed layer 43 is generated. Under a joint action of the spin orbit torque effect and the spin transfer torque effect, the magnetization direction of the first free layer 41 is controlled to reverse to facing away from the spin orbit coupling layer 20. In other words, the magnetization direction of the first free layer 41 is controlled to reverse to be antiparallel to (or understood as opposite to) that of the first fixed layer 43. In this way, the storage state of the storage component 100 is the high resistive state shown in FIG. 4*d*.

In other words, by applying the positive voltage signal to the spin orbit coupling layer 20 to generate the positive in-plane current Iin, and by applying the positive voltage signal to the first magnetic tunnel junction 40 to generate the positive first spin polarization current I40, the storage component 100 may change to be in the high resistive state from the medium resistive state.

Figure 11B:
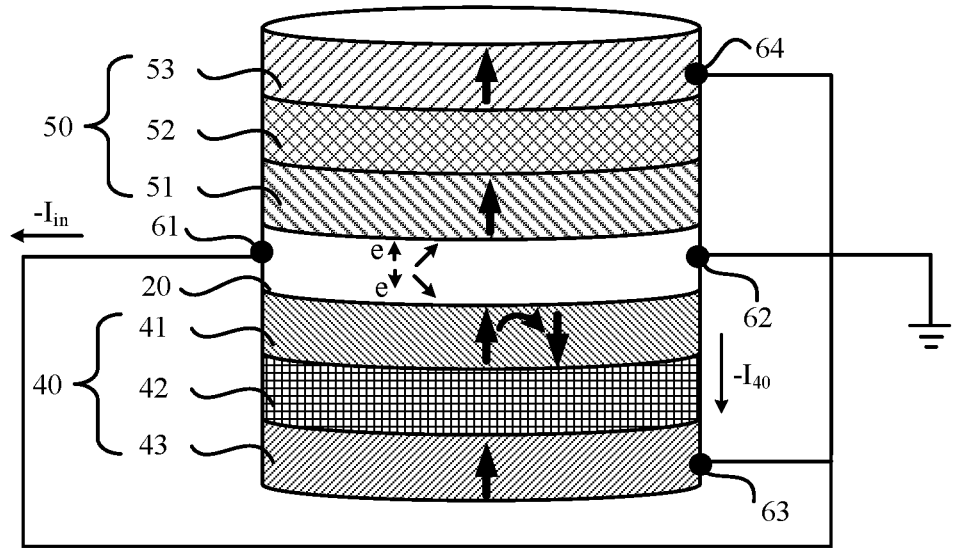
FIG. 11b is a diagram of another writing principle of a storage component according to an embodiment of this application.

In some embodiments, as shown in FIG. 11*b*, according to the write instruction, a negative voltage signal is applied to the spin orbit coupling layer 20, and a negative voltage signal is applied to the first magnetic tunnel junction 40. In this way, under an action of a spin orbit torque effect of the spin orbit coupling layer 20 and a spin transfer torque effect of the first magnetic tunnel junction 40, the magnetization direction of the first free layer 41 is reversed to facing toward the spin orbit coupling layer 20, the first magnetic tunnel junction 40 changes to be in a low resistive state, the storage component 100 changes to be in a medium resistive state from a high resistive state, and data corresponding to the medium resistive state is written into the storage component 100.

When the medium resistive state needs to be written, as shown in FIG. 4b, the magnetization direction of the first free layer 41 needs to be facing toward the spin orbit coupling layer 20, and the magnetization direction of the second free layer 51 needs to be facing away from the spin orbit coupling layer 20. When a current storage state of the storage component 100 is the high resistive state, as shown in FIG. 4d, both the magnetization direction of the first free layer 41 and the magnetization direction of the second free layer 51 are facing away from the spin orbit coupling layer 20. Therefore, the magnetization direction of the first free layer 41 needs to be reversed from facing away from the spin orbit coupling layer 20 to facing toward the spin orbit coupling layer 20.

On this basis, as shown in FIG. 11b, the negative voltage signal is applied to the spin orbit coupling layer 20, a negative in-plane current –Iin is generated in the spin orbit coupling layer 20, and a spin orbit torque facing toward the spin orbit coupling layer 20 is generated. The negative voltage signal is applied to the first magnetic tunnel junction 40, a negative first spin polarization current –I40 is generated in the first magnetic tunnel junction 40, and a spin transfer torque parallel to the magnetization direction of the first fixed layer 43 is generated. Under a joint action of the spin orbit torque effect and the spin transfer torque effect, the magnetization direction of the first free layer 41 is controlled to reverse to facing toward the spin orbit coupling layer 20. In other words, the magnetization direction of the first free layer 41 is controlled to reverse to be parallel to (or understood as the same as) that of the first fixed layer 43. In this way, the storage state of the storage component 100 is the medium resistive state shown in FIG. 4b.

In other words, by applying the negative voltage signal to the spin orbit coupling layer 20 to generate the negative in-plane current –Iin, and by applying the negative voltage signal to the first magnetic tunnel junction 40 to generate the negative first spin polarization current –I40, the storage component 100 may change to be in the medium resistive state from the high resistive state.

In some other embodiments, operation S2000 includes: Separately apply the voltage signal to the second magnetic tunnel junction 50 and the spin orbit coupling layer 20.

The voltage signal is used to change the resistive state of the second magnetic tunnel junction 50, so as to change a resistive state of the storage component 100, and data corresponding to the resistive state of the storage component 100 is written into the storage component 100.

The voltage signal is applied to the spin orbit coupling layer 20, and an in-plane current Iin is generated in the spin orbit coupling layer 20, so that a spin orbit torque is generated. The voltage signal is applied to a fourth electrode 64 of the second magnetic tunnel junction 50, and a current flowing from a second fixed layer 53 to a second free layer 51 is formed in the second magnetic tunnel junction 50, so that a spin transfer torque is generated in the second magnetic tunnel junction 50. A magnetization direction of the second free layer 51 is controlled to reverse under a joint action of a spin orbit torque effect and a spin transfer torque effect.

Depending on a requirement, a direction of the spin orbit torque of the spin orbit coupling layer 20 may be adjusted by adjusting a positive voltage signal or a negative voltage signal applied to the spin orbit coupling layer 20. A direction of the spin transfer torque may be adjusted by adjusting a positive voltage signal or a negative voltage signal applied to the fourth electrode 64. In this way, the magnetization direction of the second free layer 51 is controlled to reverse to facing away from the spin orbit coupling layer 20 or facing toward the spin orbit coupling layer 20.

Figure 12A:
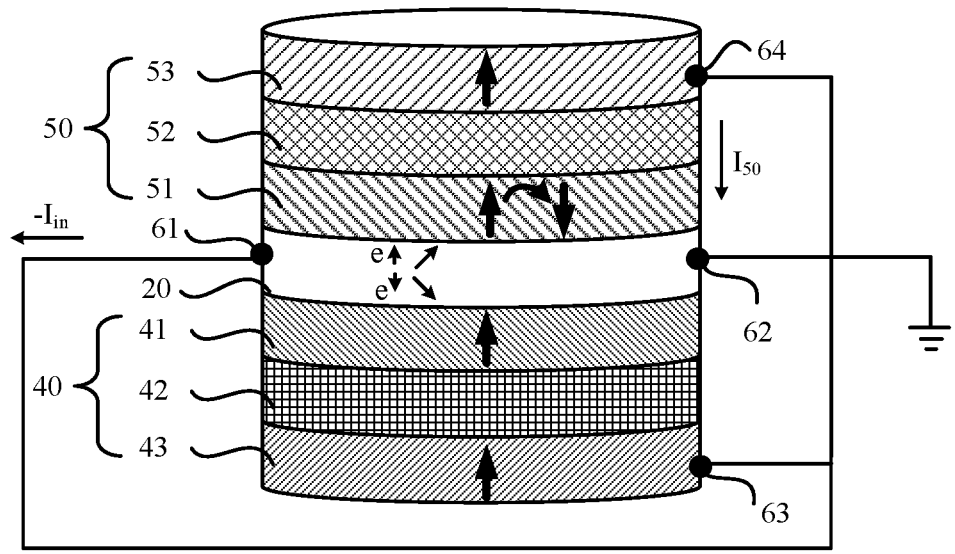
FIG. 12a is a diagram of still another writing principle of a storage component according to an embodiment of this application.

In some embodiments, as shown in FIG. 12a, according to the write instruction, a negative voltage signal is applied to the spin orbit coupling layer 20, and a positive voltage signal is applied to the second magnetic tunnel junction 50. In this way, under an action of a spin orbit torque effect of the spin orbit coupling layer 20 and a spin transfer torque effect of the second magnetic tunnel junction 50, the magnetization direction of the second free layer 51 is reversed to facing toward the spin orbit coupling layer 20, the second magnetic tunnel junction 50 changes to be in a high resistive state, the storage component 100 changes to be in a low resistive state from a medium resistive state, and data corresponding to the low resistive state is written into the storage component 100.

When the low resistive state needs to be written, as shown in FIG. 4a, both the magnetization direction of the first free layer 41 and the magnetization direction of the second free layer 51 need to be facing toward the spin orbit coupling layer 20. When a current storage state of the storage component 100 is the medium resistive state, as shown in FIG. 4b, the magnetization direction of the first free layer 41 is facing toward the spin orbit coupling layer 20, and the magnetization direction of the second free layer 51 is facing away from the spin orbit coupling layer 20. Therefore, the magnetization direction of the second free layer 51 needs to be reversed from facing away from the spin orbit coupling layer 20 to facing toward the spin orbit coupling layer 20.

On this basis, as shown in FIG. 12a, the negative voltage signal is applied to the spin orbit coupling layer 20, a negative in-plane current –Iin is generated in the spin orbit coupling layer 20, and a spin orbit torque facing toward the spin orbit coupling layer 20 is generated. The positive voltage signal is applied to the second magnetic tunnel junction 50, a positive second spin polarization current I50 is generated in the second magnetic tunnel junction 50, and a spin transfer torque antiparallel to the magnetization direction of the second fixed layer 53 is generated. Under a joint action of the spin orbit torque effect and the spin transfer torque effect, the magnetization direction of the second free layer 51 is controlled to reverse to facing toward the spin orbit coupling layer 20. In other words, the magnetization direction of the second free layer 51 is controlled to reverse to be antiparallel to (or understood as opposite to) that of the second fixed layer 53. Therefore, the storage state of the storage component 100 is the low resistive state shown in FIG. 4a.

In other words, by applying the negative voltage signal to the spin orbit coupling layer 20 to generate the negative in-plane current –Iin, and by applying the positive voltage signal to the second magnetic tunnel junction 50 to generate the positive second spin polarization current I50, the storage component 100 may change to be in the low resistive state from the medium resistive state.

Figure 12B:
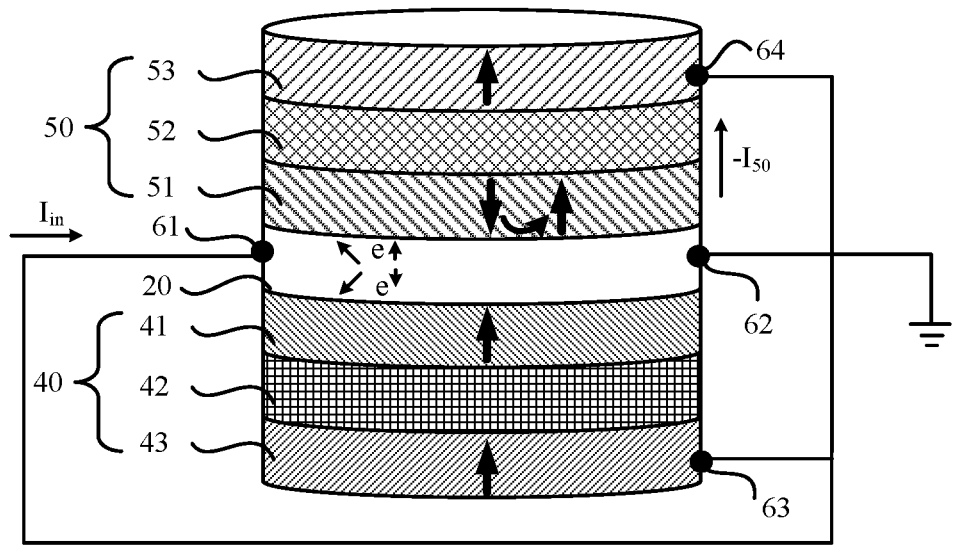
FIG. 12b is a diagram of yet another writing principle of a storage component according to an embodiment of this application.

In some embodiments, as shown in FIG. 12b, according to the write instruction, a positive voltage signal is applied to the spin orbit coupling layer 20, and a negative voltage signal is applied to the second magnetic tunnel junction 50.

In this way, under an action of a spin orbit torque effect of the spin orbit coupling layer 20 and a spin transfer torque effect of the second magnetic tunnel junction 50, the magnetization direction of the second free layer 51 is reversed to facing away from the spin orbit coupling layer 20, the second magnetic tunnel junction 50 changes to be in a low resistive state, the storage component 100 changes to be in a medium resistive state from a low resistive state, and data corresponding to the medium resistive state is written into the storage component 100.

When the medium resistive state needs to be written, as shown in FIG. 4b, the magnetization direction of the first free layer 41 needs to be facing toward the spin orbit coupling layer 20, and the magnetization direction of the second free layer 51 needs to be facing away from the spin orbit coupling layer 20. When a current storage state of the storage component 100 is the low resistive state, as shown in FIG. 4a, both the magnetization direction of the first free layer 41 and the magnetization direction of the second free layer 51 are facing toward the spin orbit coupling layer 20. Therefore, the magnetization direction of the second free layer 51 needs to be reversed from facing toward the spin orbit coupling layer 20 to facing away from the spin orbit coupling layer 20.

On this basis, as shown in FIG. 12b, the positive voltage signal is applied to the spin orbit coupling layer 20, a positive in-plane current Iin is generated in the spin orbit coupling layer 20, and a spin orbit torque facing away from the spin orbit coupling layer 20 is generated. The negative voltage signal is applied to the second magnetic tunnel junction 50, a negative second spin polarization current –I50 is generated in the second magnetic tunnel junction 50, and a spin transfer torque parallel to the magnetization direction of the second fixed layer 53 is generated. Under a joint action of the spin orbit torque effect and the spin transfer torque effect, the magnetization direction of the second free layer 51 is controlled to reverse to facing away from the spin orbit coupling layer 20. In other words, the magnetization direction of the second free layer 51 is controlled to reverse to be parallel to (or understood as the same as) that of the second fixed layer 53. In this way, the storage state of the storage component 100 is the medium resistive state shown in FIG. 4b.

In other words, by applying the positive voltage signal to the spin orbit coupling layer 20 to generate the positive in-plane current Iin, and by applying the negative voltage signal to the second magnetic tunnel junction 50 to generate the negative second spin polarization current –I50, the storage component 100 may change to be in the medium resistive state from the low resistive state.

In some other embodiments, operation S2000 includes: Separately apply the voltage signal to the first magnetic tunnel junction 40, the second magnetic tunnel junction 50, and the spin orbit coupling layer 20. The voltage signal is used to change resistive states of the first magnetic tunnel junction 40 and the second magnetic tunnel junction 50, so as to change a resistive state of the storage component 100, and write, into the storage component 100, data corresponding to the resistive state of the storage component 100 is written.

The voltage signal is applied to the spin orbit coupling layer 20, and an in-plane current Iin is generated in the spin orbit coupling layer 20, so that a spin orbit torque is generated. The voltage signal is applied to a third electrode 63 of the first magnetic tunnel junction 40, and a current flowing from a first fixed layer 43 to a first free layer 41 is formed in the first magnetic tunnel junction 40, so that a spin transfer torque is generated in the first magnetic tunnel junction 40. A magnetization direction of the first free layer 41 is controlled to reverse under a joint action of a spin orbit torque effect and a spin transfer torque effect.

Depending on a requirement, a direction of the spin orbit torque of the spin orbit coupling layer 20 may be adjusted by adjusting a positive voltage signal or a negative voltage signal applied to the spin orbit coupling layer 20. A direction of the spin transfer torque may be adjusted by adjusting a positive voltage signal or a negative voltage signal applied to the third electrode 63. In this way, the magnetization direction of the first free layer 41 is controlled to reverse to facing away from the spin orbit coupling layer 20 or facing toward the spin orbit coupling layer 20.

In addition, the voltage signal is applied to a fourth electrode 64 of the second magnetic tunnel junction 50, and a current flowing from a second fixed layer 53 to a second free layer 51 is formed in the second magnetic tunnel junction 50, so that a spin transfer torque is generated in the second magnetic tunnel junction 50. A magnetization direction of the second free layer 51 is controlled to reverse under a joint action of the spin orbit torque effect and the spin transfer torque effect.

Depending on a requirement, a direction of the spin orbit torque of the spin orbit coupling layer 20 may be adjusted by adjusting a positive voltage signal or a negative voltage signal applied to the spin orbit coupling layer 20. A direction of the spin transfer torque may be adjusted by adjusting a positive voltage signal or a negative voltage signal applied to the fourth electrode 64. In this way, the magnetization direction of the second free layer 51 is controlled to reverse to facing away from the spin orbit coupling layer 20 or facing toward the spin orbit coupling layer 20.

Figure 13A:
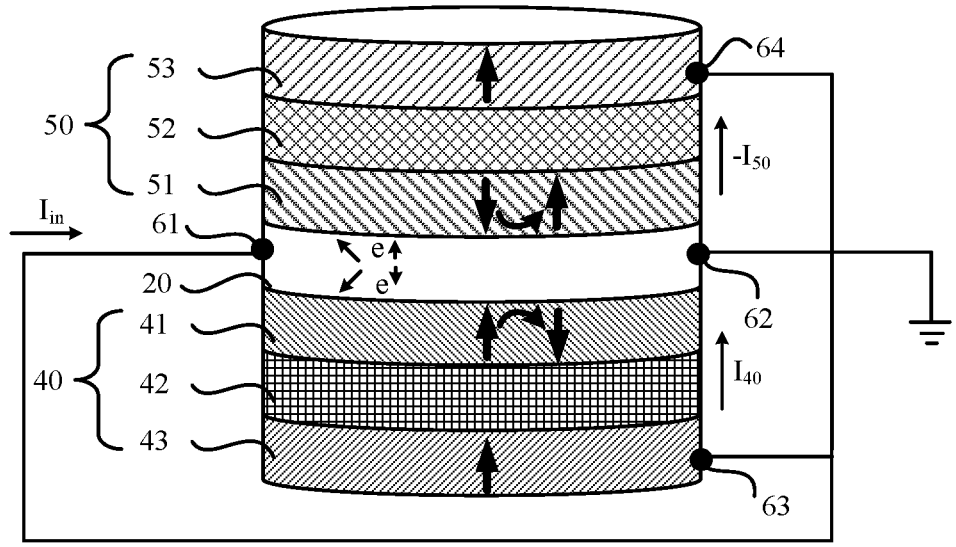
FIG. 13a is a diagram of still yet another writing principle of a storage component according to an embodiment of this application.

In some embodiments, as shown in FIG. 13a, according to the write instruction, a positive voltage signal is applied to the spin orbit coupling layer 20, a positive voltage signal is applied to the first magnetic tunnel junction 40, and a negative voltage signal is applied to the second magnetic tunnel junction 50. In this way, under an action of a spin orbit torque effect of the spin orbit coupling layer 20 and a spin transfer torque effect of the first magnetic tunnel junction 40, the magnetization direction of the first free layer 41 is reversed to facing away from the spin orbit coupling layer 20, and the first magnetic tunnel junction 40 changes to be in a high resistive state. Under an action of the spin orbit torque effect of the spin orbit coupling layer 20 and a spin transfer torque effect of the second magnetic tunnel junction 50, the magnetization direction of the second free layer 51 is reversed to facing away from the spin orbit coupling layer 20, the second magnetic tunnel junction 50 changes to be in a low resistive state, the storage component 100 changes to be in a high resistive state from a low resistive state, and data corresponding to the high resistive state is written into the storage component 100.

When the high resistive state needs to be written, as shown in FIG. 4d, both the magnetization direction of the first free layer 41 and the magnetization direction of the second free layer 51 need to be facing away from the spin orbit coupling layer 20. When a current storage state of the storage component 100 is the low resistive state, as shown in FIG. 4a, both the magnetization direction of the first free layer 41 and the magnetization direction of the second free layer 51 are facing toward the spin orbit coupling layer 20. Therefore, the magnetization direction of the first free layer 41 needs to be reversed from facing toward the spin orbit coupling layer 20 to facing away from the spin orbit coupling layer 20, and the magnetization direction of the second free layer 51 needs to be reversed from facing toward the spin orbit coupling layer 20 to facing away from the spin orbit coupling layer 20.

On this basis, as shown in FIG. 13a, the positive voltage signal is applied to the spin orbit coupling layer 20, a positive in-plane current Iin is generated in the spin orbit coupling layer 20, and a spin orbit torque facing away from the spin orbit coupling layer 20 is generated. The positive voltage signal is applied to the first magnetic tunnel junction 40, a positive first spin polarization current I40 is generated in the first magnetic tunnel junction 40, and a spin transfer torque antiparallel to the magnetization direction of the first fixed layer 43 is generated. Under a joint action of the spin orbit torque effect and the spin transfer torque effect, the magnetization direction of the first free layer 41 is controlled to reverse to facing away from the spin orbit coupling layer 20. In other words, the magnetization direction of the first free layer 41 is controlled to reverse to be antiparallel to (or understood as opposite to) that of the first fixed layer 43.

In addition, the negative voltage signal is applied to the second magnetic tunnel junction 50, a negative second spin polarization current −I50 is generated in the second magnetic tunnel junction 50, and a spin transfer torque parallel to the magnetization direction of the second fixed layer 53 is generated. Under a joint action of the spin orbit torque effect and the spin transfer torque effect, the magnetization direction of the second free layer 51 is controlled to reverse to facing away from the spin orbit coupling layer 20. In other words, the magnetization direction of the second free layer 51 is controlled to reverse to be parallel to (or understood as the same as) the second fixed layer 53. In this way, the storage state of the storage component 10 is the high resistive state shown in FIG. 4d.

In other words, by applying the positive voltage signal to the spin orbit coupling layer 20 to generate the positive in-plane current Iin, by applying the positive voltage signal to the first magnetic tunnel junction 40 to generate the positive first spin polarization current I40, and by applying the negative voltage signal to the second magnetic tunnel junction 50 to generate the negative second spin polarization current −I50, the storage component 100 may change to be in the high resistive state from the low resistive state.

Figure 13B:
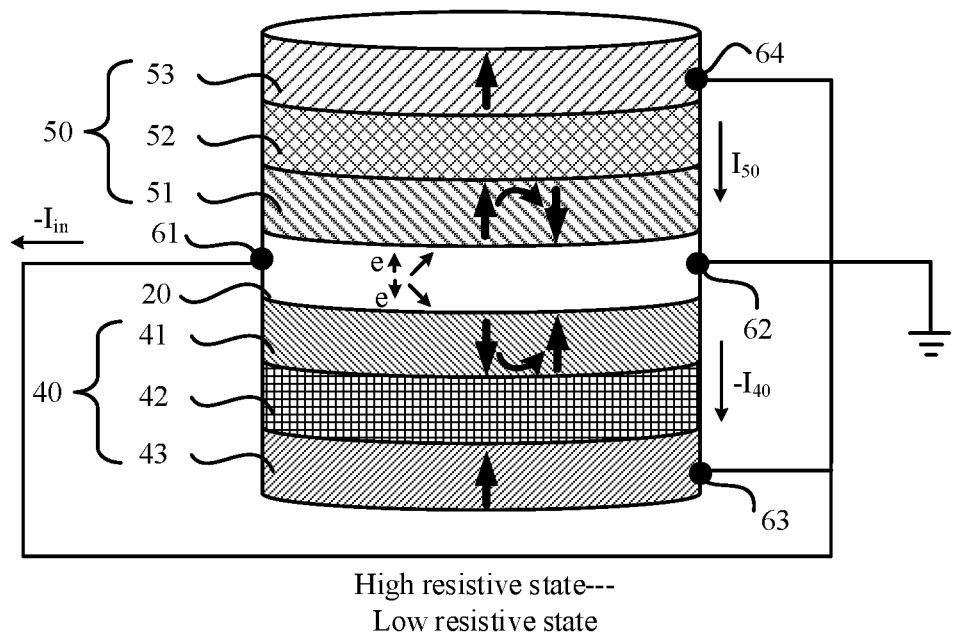
FIG. 13b is a diagram of a further writing principle of a storage component according to an embodiment of this application.

In some embodiments, as shown in FIG. 13b, according to the write instruction, a negative voltage signal is applied to the spin orbit coupling layer 20, a negative voltage signal is applied to the first magnetic tunnel junction 40, and a positive voltage signal is applied to the second magnetic tunnel junction 50. In this way, under an action of a spin orbit torque effect of the spin orbit coupling layer 20 and a spin transfer torque effect of the first magnetic tunnel junction 40, the magnetization direction of the first free layer 41 is reversed to facing toward the spin orbit coupling layer 20, and the first magnetic tunnel junction 40 changes to be in a low resistive state. Under an action of the spin orbit torque effect of the spin orbit coupling layer 20 and a spin transfer torque effect of the second magnetic tunnel junction 50, the magnetization direction of the second free layer 51 is reversed to facing toward the spin orbit coupling layer 20, the second magnetic tunnel junction 50 changes to be in a high resistive state, the storage component 100 changes to be in a low resistive state from a high resistive state, and data corresponding to the low resistive state is written into the storage component 100.

When the low resistive state needs to be written, as shown in FIG. 4a, both the magnetization direction of the first free layer 41 and the magnetization direction of the second free layer 51 need to be facing toward the spin orbit coupling layer 20. When a current storage state of the storage component 100 is the high resistive state, as shown in FIG. 4d, both the magnetization direction of the first free layer 41 and the magnetization direction of the second free layer 51 are facing away from the spin orbit coupling layer 20. Therefore, the magnetization direction of the first free layer 41 needs to be reversed from facing away from the spin orbit coupling layer 20 to facing toward the spin orbit coupling layer 20, and the magnetization direction of the second free layer 51 needs to be reversed from facing away from the spin orbit coupling layer 20 to facing toward the spin orbit coupling layer 20.

Based on this, as shown in FIG. 13b, the negative voltage signal is applied to the spin orbit coupling layer 20, a negative in-plane current −Iin is generated in the spin orbit coupling layer 20, and a spin orbit torque facing toward the spin orbit coupling layer 20 is generated. The negative voltage signal is applied to the first magnetic tunnel junction 40, a negative first spin polarization current −I40 is generated in the first magnetic tunnel junction 40, and a spin transfer torque parallel to the magnetization direction of the first fixed layer 43 is generated. Under a joint action of the spin orbit torque effect and the spin transfer torque effect, the magnetization direction of the first free layer 41 is controlled to reverse to facing toward the spin orbit coupling layer 20. In other words, the magnetization direction of the first free layer 41 is controlled to reverse to be parallel to (or understood as the same as) the first fixed layer 43.

In addition, the positive voltage signal is applied to the second magnetic tunnel junction 50, a positive second spin polarization current I50 is generated in the second magnetic tunnel junction 50, and a spin transfer torque antiparallel to the magnetization direction of the second fixed layer 53 is generated. Under a joint action of the spin orbit torque effect and the spin transfer torque effect, the magnetization direction of the second free layer 51 is controlled to reverse to facing toward the spin orbit coupling layer 20. In other words, the magnetization direction of the second free layer 51 is controlled to reverse to be antiparallel to (or understood as opposite to) the second fixed layer 53. Therefore, the storage state of the storage component 100 is the low resistive state shown in FIG. 4a.

In other words, by applying the negative voltage signal to the spin orbit coupling layer 20 to generate the negative in-plane current −Iin, by applying the negative voltage signal to the first magnetic tunnel junction 40 to generate the negative first spin polarization current −I40, and by applying the positive voltage signal to the second magnetic tunnel junction 50 to generate the positive second spin polarization current I50, the storage component 100 may change to be in the low resistive state from the high resistive state.

In other words, a writing principle of the storage component 100 provided in this embodiment of this application is as follows: When the magnetization direction of the first free layer 41 or the magnetization direction of the second free layer 51 needs to be reversed to facing away from the spin orbit coupling layer 20, a positive voltage signal is applied to the spin orbit coupling layer 20. Similarly, when the magnetization direction of the free layer 41 or the magnetization direction of the second free layer 51 needs to be reversed to facing toward the spin orbit coupling layer 20, a negative voltage signal is applied to the spin orbit coupling layer 20.

In addition, when the magnetization direction of the first free layer 41 needs to be reversed to facing away from the spin orbit coupling layer 20, a positive voltage signal is applied to the third electrode 63 of the first magnetic tunnel junction 40. Similarly, when the magnetization direction of the first free layer 41 needs to be reversed to facing toward the spin orbit coupling layer 20, a negative voltage signal is applied to the third electrode 63 of the first magnetic tunnel junction 40.

When the magnetization direction of the second free layer 51 needs to be reversed to facing away from the spin orbit coupling layer 20, a negative voltage signal is applied to the fourth electrode 64 of the second magnetic tunnel junction 50. Similarly, when the magnetization direction of the second free layer 51 needs to be reversed to facing toward the spin orbit coupling layer 20, a positive voltage signal is applied to the fourth electrode 64 of the second magnetic tunnel junction 50.

It should be noted that, when the writing method of the storage component 100 provided in this embodiment of this application is described above, only an example in which when the storage component 100 is in the medium resistive state, the magnetization directions of the first free layer 41 and the second free layer 51 are shown in FIG. 4b is used. If the magnetization directions of the first free layer 41 and the second free layer 51 are shown in FIG. 4c when the storage component 100 is in the medium resistive state, the foregoing principle is used to control the magnetization directions of the first free layer 41 and the second free layer 51 to be reversed correspondingly.

For example, according to the write instruction, a negative voltage signal is applied to the spin orbit coupling layer 20, and a negative voltage signal is applied to the first magnetic tunnel junction 40. In this way, under an action of a spin orbit torque effect of the spin orbit coupling layer 20 and a spin transfer torque effect of the first magnetic tunnel junction 40, the magnetization direction of the first free layer 41 is reversed to facing toward the spin orbit coupling layer 20, the first magnetic tunnel junction 40 changes to be in a low resistive state, the storage component 100 changes to be in a low resistive state from a medium resistive state, and data corresponding to the low resistive state is written into the storage component 100.

According to the write instruction, a positive voltage signal is applied to the spin orbit coupling layer 20, and a positive voltage signal is applied to the first magnetic tunnel junction 40. In this way, under an action of a spin orbit torque effect of the spin orbit coupling layer 20 and a spin transfer torque effect of the first magnetic tunnel junction 40, the magnetization direction of the first free layer 41 is reversed to facing away from the spin orbit coupling layer 20, the first magnetic tunnel junction 40 changes to be in a high resistive state, the storage component 100 changes to be in a medium resistive state from a low resistive state, and data corresponding to the medium resistive state is written into the storage component 100.

According to the write instruction, a positive voltage signal is applied to the spin orbit coupling layer 20, and a negative voltage signal is applied to the second magnetic tunnel junction 50. In this way, under an action of a spin orbit torque effect of the spin orbit coupling layer 20 and a spin transfer torque effect of the second magnetic tunnel junction 50, the magnetization direction of the second free layer 51 is reversed to facing away from the spin orbit coupling layer 20, the second magnetic tunnel junction 50 changes to be in a low resistive state, the storage component 100 changes to be in a high resistive state from a medium resistive state, and data corresponding to the high resistive state is written into the storage component 100.

According to the write instruction, a negative voltage signal is applied to the spin orbit coupling layer 20, and a positive voltage signal is applied to the second magnetic tunnel junction 50. In this way, under an action of a spin orbit torque effect of the spin orbit coupling layer 20 and a spin transfer torque effect of the second magnetic tunnel junction 50, the magnetization direction of the second free layer 51 is reversed to facing toward the spin orbit coupling layer 20, the second magnetic tunnel junction 50 changes to be in a high resistive state, the storage component 100 changes to be in a medium resistive state from a high resistive state, and data corresponding to the medium resistive state is written into the storage component 100.

Data writing when the storage component changes to be in the high resistive state from the low resistive state and data writing when the storage component changes to be in the low resistive state from the high resistive state are the same as the descriptions above.

For example, the low resistive state may be marked as 0 in a computer machine language, the medium resistive state may be marked as 1 in the computer machine language, and the high resistive state may be marked as 2 in the computer machine language, so as to correspond to ternary "0", "1", and "2" in the computer machine language. The language "0", "1", and "2" corresponding to a resistive state is stored in the storage component 100, and then a write operation of the storage component 100 is completed. Certainly, this is merely an example, and no limitation is imposed herein.

According to the storage component 100 provided in this embodiment of this application, the first magnetic tunnel junction 40 has two resistive states: a low resistive state and a high resistive state, and the second magnetic tunnel junction 50 also has two resistive states: a low resistive state and a high resistive state. Therefore, after mixed combination, the storage component 100 has three states: a low resistive state, a medium resistive state, and a high resistive state. Compared with a conventional storage component in which a low resistive state and a high resistive state are formed based on parallelism or antiparallelism between a free layer and a fixed layer, the storage component 100 provided in this embodiment of this application can implement multi-state storage.

In addition, because the first magnetic tunnel junction 40 and the second magnetic tunnel junction 50 are respectively arranged on two sides of the spin orbit coupling layer 20 in the storage component 100, which are equivalent to two resistors disposed in parallel, a maximum resistance is doubled, so that a maximum resistance of the storage component 100 is increased, and a corresponding interval from the low resistive state to the high resistive state is also relatively large, so that a resistive state value range is enlarged. When the resistive state value range is enlarged, a difference between the resistive states may be increased, so that a degree of differentiation among the resistive states is increased, and read/write accuracy of multi-state storage can be improved. For example, a resistive state value range is 1000 ohms to 2500 ohms in a related technology. The resistive state value range may be divided for the three resistive states in a manner in which 1000 ohms, 1750 ohms and 2500 ohms each correspond to one resistive state, where a difference between adjacent resistive states is 750 ohms. If a resistive state value range is 1000 ohms to 5000 ohms, the resistive state value range may be divided for the three resistive states in a manner in which 1000 ohms, 3000 ohms and 5000 ohms each correspond to one resistive state, where a difference between adjacent resistive states is 2000 ohms, so that the degree of differentiation among the resistive states is obviously increased.

In addition, in the storage component 100 provided in this embodiment of this application, mutual conversion among the resistive states is completed under a joint action of a spin orbit torque effect and a spin transfer torque effect, so as to complete data writing with high working efficiency.

Embodiment 3

Figure 14:
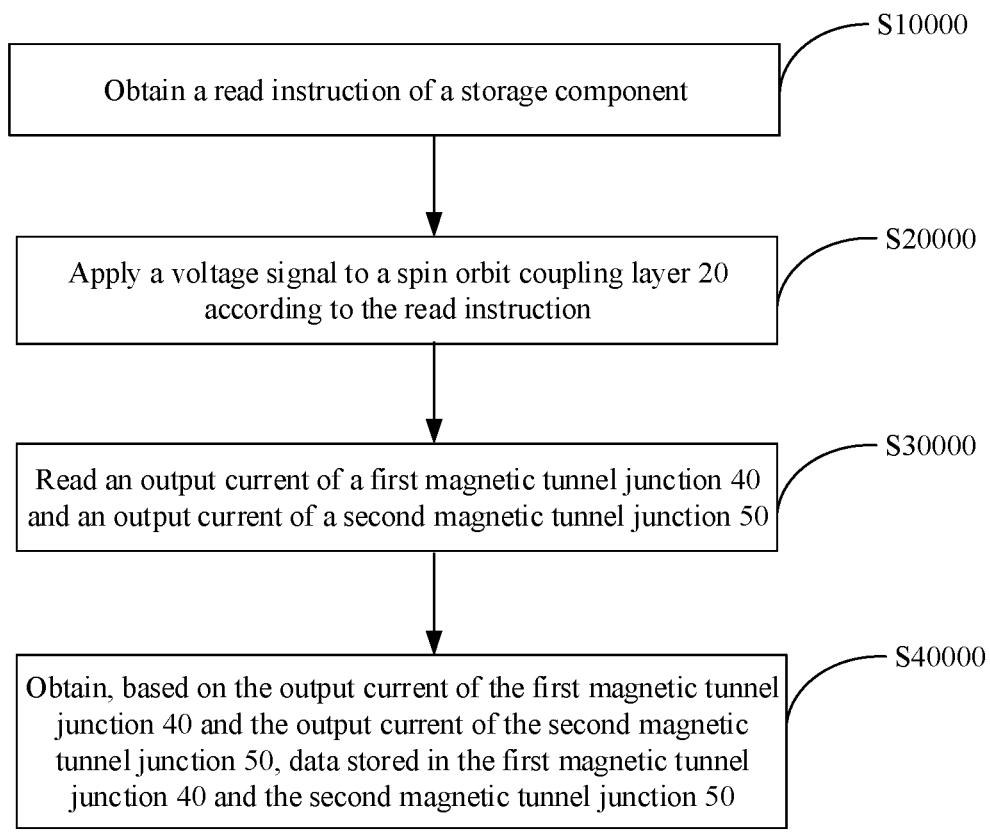
FIG. 14 is a flowchart of another reading method of a storage component according to an embodiment of this application.

As shown in FIG. 14, a reading method of a storage component 100 in this embodiment of this application includes the following operations.

S10000: Obtain a read instruction of a storage component.

S20000: Apply a voltage signal to a spin orbit coupling layer 20 according to the read instruction.

In other words, the voltage signal is applied to a first electrode 61 according to the read instruction. After the voltage signal enters the spin orbit coupling layer 20, an in-plane current Iin is formed in the spin orbit coupling layer 20. A spin-down spin carrier in the in-plane current Iin flows to a third electrode 63 after passing through a first magnetic tunnel junction 40, and a spin-up spin carrier flows to a fourth electrode 64 after passing through a second magnetic tunnel junction 50.

A principle of a magnetic tunnel junction is as follows: The magnetic tunnel junction includes three layers: a magnetic layer (fixed layer), a non-ferromagnetic layer (tunneling layer), and a magnetic layer (free layer). The fixed layer has a large coercive force, and a magnetization direction of the fixed layer is not easily reversed. The free layer has a small coercive force, and the magnetization direction of the fixed layer is easily reversed. When a magnetization direction of the free layer is parallel to that of the fixed layer, a resistance of the entire magnetic tunnel junction is relatively small. When the magnetization direction of the free layer is antiparallel to that of the fixed layer, a resistance of the entire magnetic tunnel junction is relatively large.

Based on this, when a magnetization direction of a first free layer 41 in the first magnetic tunnel junction 40 is parallel to that of a first fixed layer 43, the first magnetic tunnel junction 40 is in a low resistive state, where R40=R40↑↑. When the magnetization direction of the first free layer 41 in the first magnetic tunnel junction 40 is antiparallel to that of the first fixed layer 43, the first magnetic tunnel junction 40 is in a high resistive state, where R40=R40↑↓. R40↑↑<R40↑↓.

Similarly, when a magnetization direction of a second free layer 51 in the second magnetic tunnel junction 50 is parallel to that of a second fixed layer 53, the second magnetic tunnel junction 50 is in a low resistive state, where R50=R50↑↑. When the magnetization direction of the second free layer 51 in the second magnetic tunnel junction 50 is antiparallel to that of the second fixed layer 53, the second magnetic tunnel junction 50 is in a high resistive state, where R50=R50↑↓. R50↑↑<R50↑↓.

Figure 15:
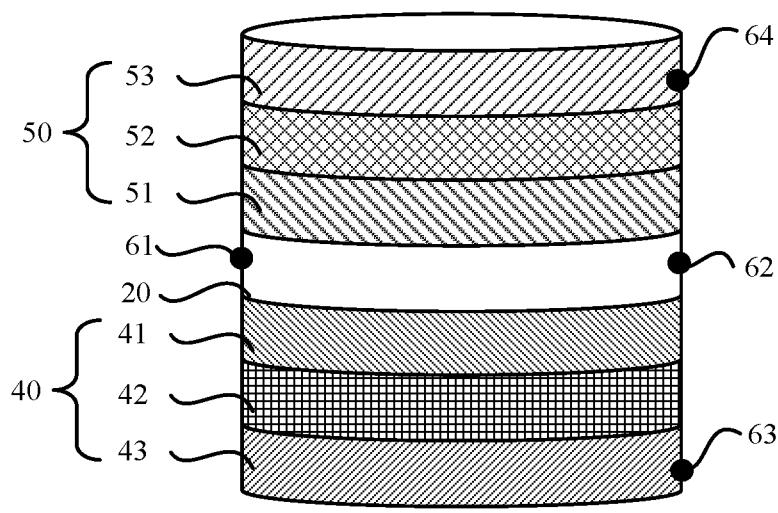
FIG. 15 is an equivalent circuit diagram of a storage component according to an embodiment of this application.
Figure 15:
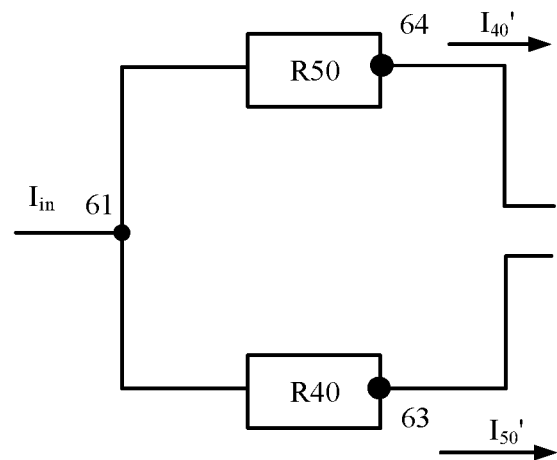

In this case, the storage component 100 may be simplified to a structure shown in FIG. 15. A structure of the storage component 100 in the upper figure of FIG. 15 may be simplified to a circuit structure in the lower figure of FIG. 15.

S30000: Read an output current I40' of the first magnetic tunnel junction 40 and an output current I50' of the second magnetic tunnel junction 50.

S40000: Obtain, based on the output current I40' of the first magnetic tunnel junction 40 and the output current I50' of the second magnetic tunnel junction 50, data stored in the first magnetic tunnel junction 40 and the second magnetic tunnel junction 50. For example, a resistive state of the storage component 100 corresponding to a difference Iout' between the output current I40' of the first magnetic tunnel junction 40 and the output current I50' of the second magnetic tunnel junction 50 is obtained according to the difference Iout' between the output current I40' of the first magnetic tunnel junction 40 and the output current I50' of the second magnetic tunnel junction 50. One Iout' corresponds to one resistive state, and resistive states may be distinguished based on Iout', so as to read a corresponding resistive state.

Figure 16:
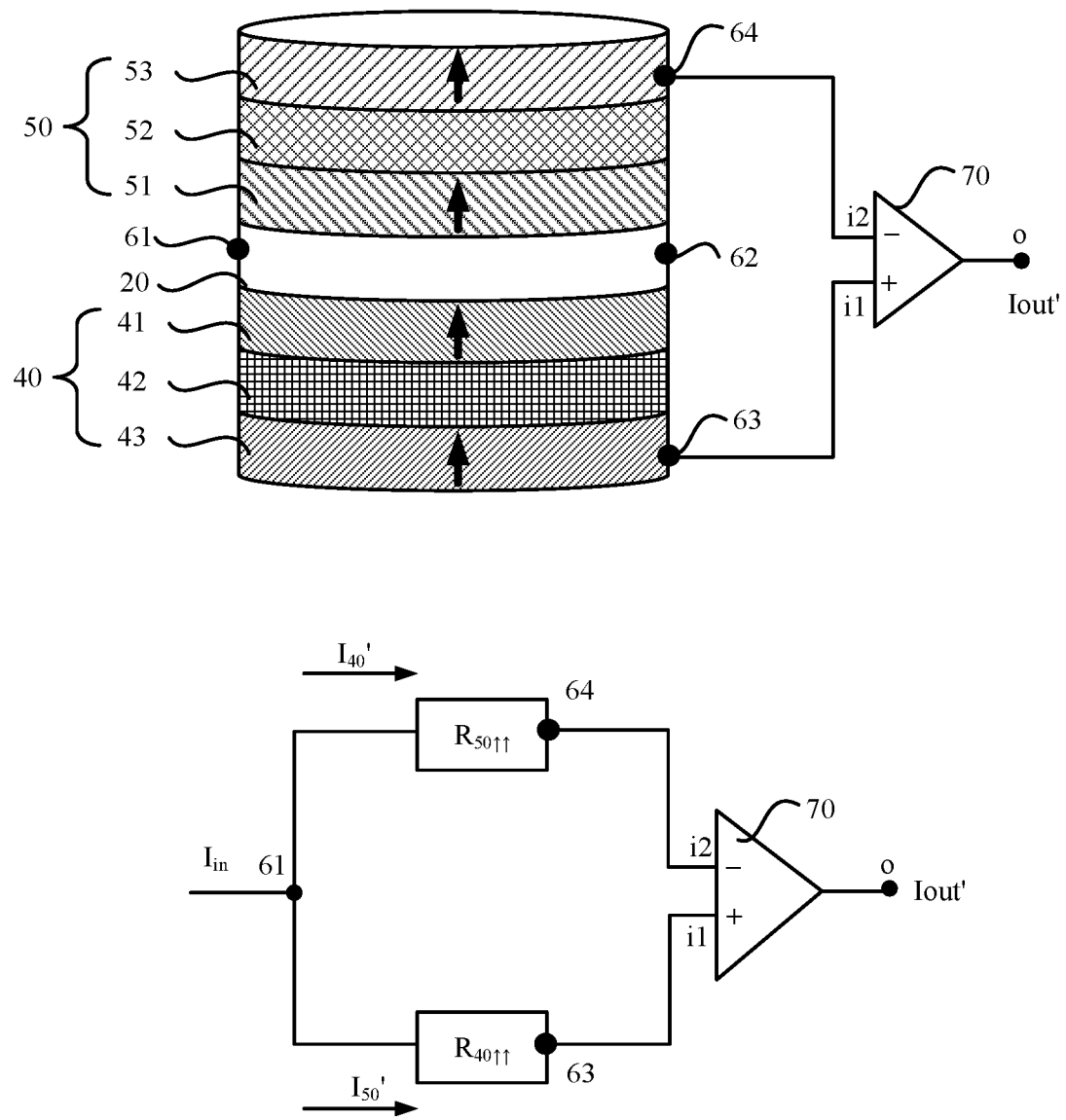
FIG. 16 is a diagram of yet another reading principle of a storage component according to an embodiment of this application.

For example, as shown in FIG. 16, Iout'=I40'−I50'=V/R40↑↑−V/R50↑↑=A. When it is detected that an output current Iout' of a differential amplifier 70 is A, it can be learned that the first magnetic tunnel junction 40 is in a low resistive state, and the magnetization direction of the first free layer 41 in the first magnetic tunnel junction 40 is parallel to that of the first fixed layer 43. The second magnetic tunnel junction is also in a low resistive state, and the magnetization direction of the second free layer 51 in the second magnetic tunnel junction 50 is parallel to that of the second fixed layer 53. It indicates that a state of the storage component 100 is the medium resistive state shown in FIG. 4b, and the medium resistive state is read.

Figure 17:
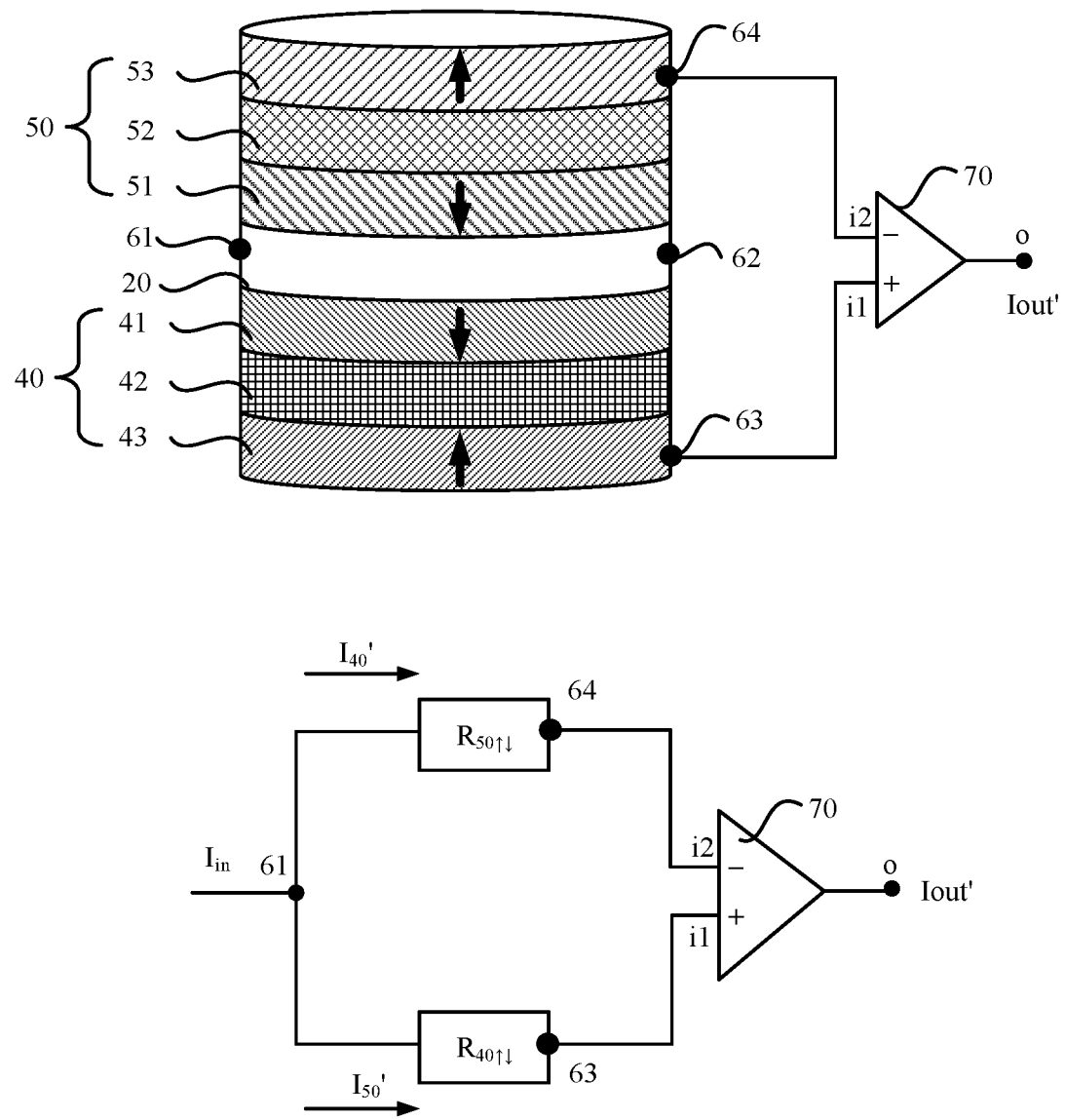
FIG. 17 is a diagram of still yet another reading principle of a storage component according to an embodiment of this application.

Similarly, as shown in FIG. 17, Iout'=V/R40↑↓−V/R50↑↓=B. When it is detected that an output current Iout' of the differential amplifier 70 is B, it can be learned that the first magnetic tunnel junction 40 is in a high resistive state, and the magnetization direction of the first free layer 41 in the first magnetic tunnel junction 40 is antiparallel to that of the first fixed layer 43. The second magnetic tunnel junction is also in a high resistive state, and the magnetization direction of the second free layer 51 in the second magnetic tunnel junction 50 is antiparallel to that of the second fixed layer 53. It indicates that a state of the storage component 100 is the medium resistive state shown in FIG. 4c, and the medium resistive state is read.

Figure 18:
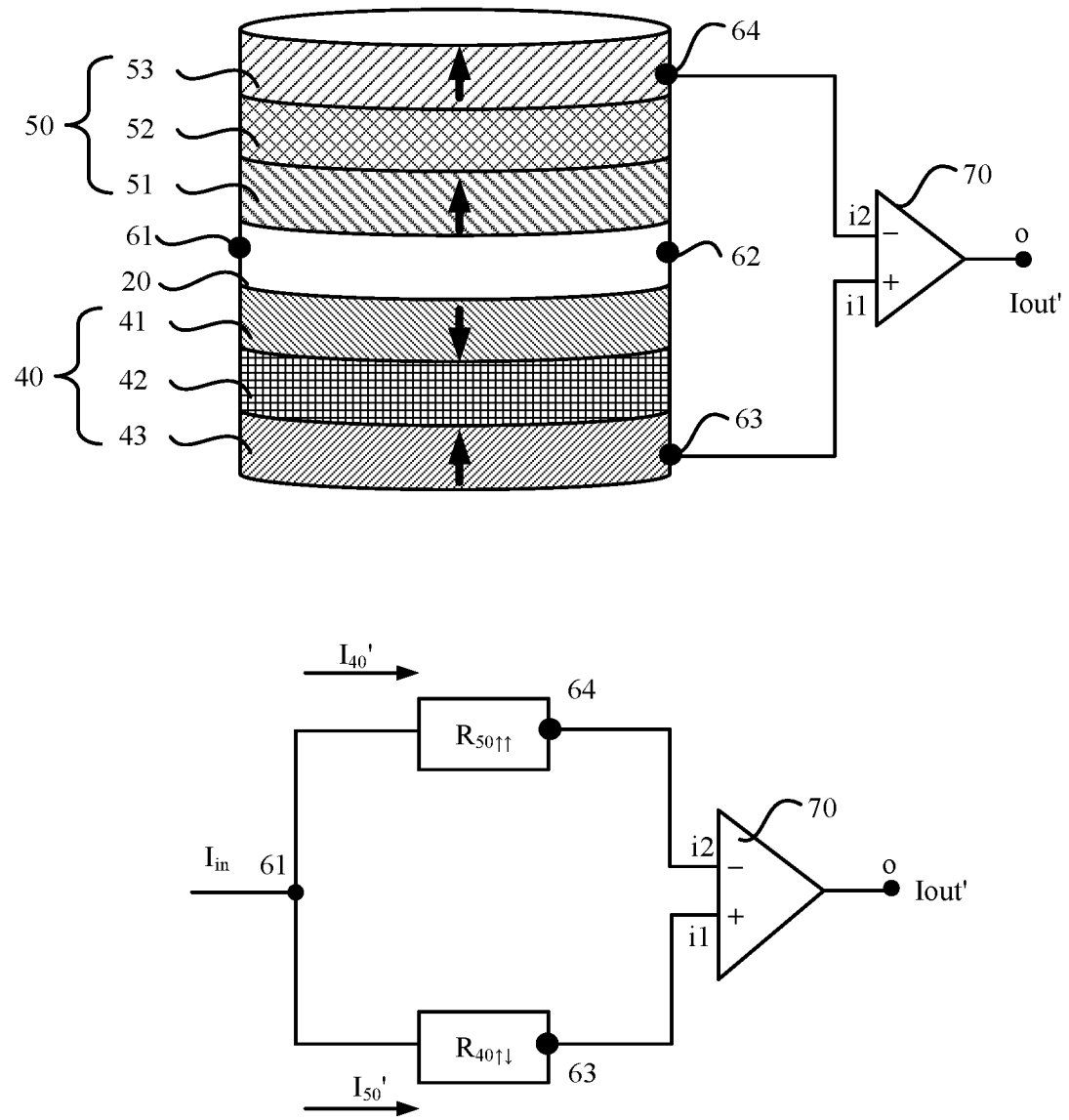
FIG. 18 is a diagram of a further reading principle of a storage component according to an embodiment of this application.

Similarly, as shown in FIG. 18, Iout'=V/R40↑↓−V/R50↑↑=C. When it is detected that an output current Iout' of the differential amplifier 70 is C, it can be learned that the first magnetic tunnel junction 40 is in a high resistive state, and the magnetization direction of the first free layer 41 in the first magnetic tunnel junction 40 is antiparallel to that of the first fixed layer 43. The second magnetic tunnel junction is in a low resistive state, and the magnetization direction of the second free layer 51 in the second magnetic tunnel junction 50 is parallel to that of the second fixed layer 53. It indicates that a state of the storage component 100 is the high resistive state shown in FIG. 4d, and the high resistive state is read.

Figure 19:
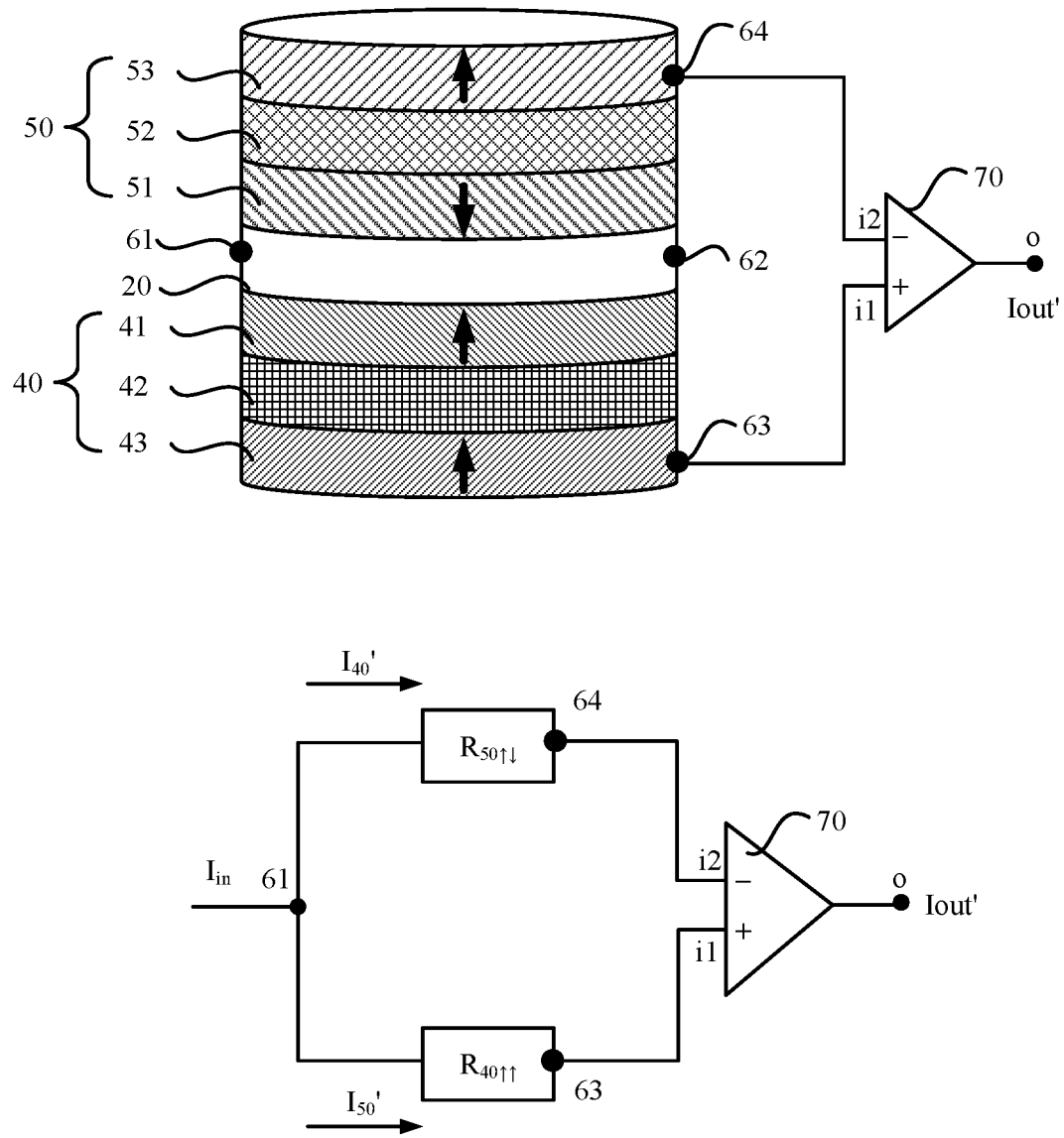
FIG. 19 is a diagram of a still further reading principle of a storage component according to an embodiment of this application.

Similarly, as shown in FIG. 19, Iout'=V/R40↑↑−V/R50↑↓=D. When it is detected that an output current Iout' of the differential amplifier 70 is D, it can be learned that the first magnetic tunnel junction 40 is in a low resistive state, and the magnetization direction of the first free layer 41 in the first magnetic tunnel junction 40 is parallel to that of the first fixed layer 43. The second magnetic tunnel junction is in a high resistive state, and the magnetization direction of the second free layer 51 in the second magnetic tunnel junction 50 is antiparallel to that of the second fixed layer 53. It indicates that a state of the storage component 100 is the low resistive state shown in FIG. 4a, and the low resistive state is read.

When the first magnetic tunnel junction 40 and the second magnetic tunnel junction 50 are of a same structure, a resistance of the first magnetic tunnel junction 40 in the low resistive state is equal to that of the second magnetic tunnel junction 50 in the low resistive state. In other words, R40↑↑=R50↑↑. In this case, V/R40↑↑=V/R50↑↑. A resistance of the first magnetic tunnel junction 40 in the high resistive state is equal to that of the second magnetic tunnel junction 50 in the high resistive state. In other words, R40↑↓=R50↑↓. In this case, V/R40↑↓=V/R50↑↓. In this case, A=B=0. Because V/R40↑↓<V/R50↑↑, C<0. Because V/R40↑↑>V/R50↑↓, D>0.

Based on this, in some embodiments, when Iout'=0, the medium resistive state is read.

When Iout'=0, Iout'=I40'−I50'=V/R40−V/R50=0, which indicates that V/R40=V/R50. In this case, as shown in FIG. 16 and FIG. 17, the state of the memory 100 is the medium resistive state shown in FIG. 4b and FIG. 4c, and the medium resistive state is read.

It may be understood that, affected by factors such as a process error and an applicable environment, the output current Iout' of the differential amplifier 70 may be approximately equal to 0. In other words, the output current Iout' of the differential amplifier 70 is 0±ϵ. ϵ is an error, which can be set depending on an experiment.

The high resistive state is read when Iout'<0.

When Iout'<0, Iout'=I40'−I50'=V/R40−V/R50<0, which indicates that V/R40 is less than V/R50. In this case, as shown in FIG. 18, the state of the memory is the high resistive state shown in FIG. 4d, and the high resistive state is read.

The low resistive state is read when Iout'>0.

When Iout'>0, Iout'=I40'−I50'=V/R40−V/R50 >0, which indicates that V/R40 is greater than V/R50. In this case, as shown in FIG. 19, the state of the storage component 100 is the low resistive state shown in FIG. 4a, and the low resistive state is read.

In this way, only the three types of output currents Iout' need to be determined and processed, so that a data processing amount can be reduced.

Figure 20:
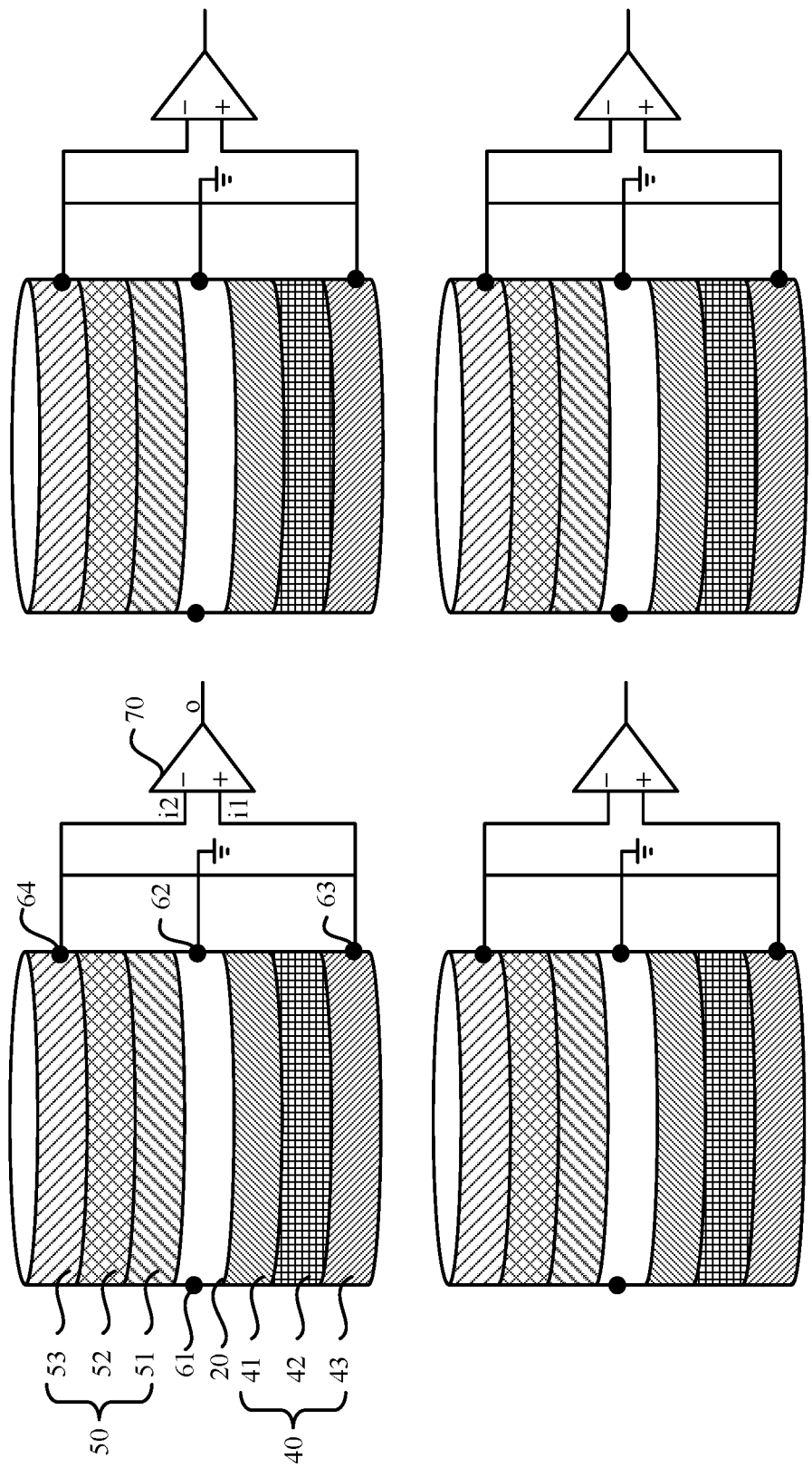
FIG. 20 is a diagram of a structure of a storage chip according to an embodiment of this application.

Based on this, in some embodiments, as shown in FIG. 20, a peripheral circuit coupled to the storage component 100 includes a differential amplifier 70.

A first input end i1 of the differential amplifier 70 is coupled to a third electrode 63, and a second input end i2 of the differential amplifier 70 is coupled to a fourth electrode 64. A first input end i1 of one differential amplifier 70 is coupled to one third electrode 63, and a second input end i2 of one differential amplifier 70 is coupled to one fourth electrode 64.

It should be noted that FIG. 20 is illustrated by using an example in which the first input end i1 of the differential amplifier 70 is a positive input end and the second input end i2 of the differential amplifier 70 is a negative input end. Certainly, the first input end i1 of the differential amplifier 70 may also be a negative input end, and the second input end i2 of the differential amplifier 70 may also be a positive input end, provided that the first input end i1 and the second input end i2 are positive and negative input ends of each other.

If the first input end i1 of the differential amplifier 70 is a positive input end, and the second input end i2 of the differential amplifier 70 is a negative input end, a result output by an output end o of the differential amplifier 70 is a difference between an output current I40' of a first magnetic tunnel junction 40 and an output current I50' of a second magnetic tunnel junction 50. If the first input end i1 of the differential amplifier 70 is a negative input end, and the second input end i2 of the differential amplifier 70 is a positive input end, a result output by the output end o of the differential amplifier 70 is an opposite number of the difference between the output current I40' of the first magnetic tunnel junction 40 and the output current I50' of the second magnetic tunnel junction 50.

For ease of description, in this embodiment of this application, an example in which the first input end i1 of the differential amplifier 70 is a positive input end and the second input end i2 of the differential amplifier 70 is a negative input end is used for description.

A first current I40' received by the first input end i1 of the differential amplifier 70 is V/R40, and a second current I50' received by the second input end i2 of the differential amplifier 70 is V/R50. V is a voltage applied to a spin orbit coupling layer 20.

After performing differential reading on a current (the output current I40' of the first magnetic tunnel junction 40) input at the first input end i1 and a current (the output current I50' of the second magnetic tunnel junction 50) input at the second input end i2, the differential amplifier 70 outputs a current from the output end o. The output current of the differential amplifier 70 is equal to a difference between the output current I40' of the first magnetic tunnel junction 40 and the output current I50' of the second magnetic tunnel junction 50, namely, Iout"=Iout'=I40'−I50'. In other words, the differential amplifier 70 is used for obtaining a difference Iout' between the output current I40' of the first magnetic tunnel junction 40 and the output current I50' of the second magnetic tunnel junction 50.

The differential amplifier 70 is used for amplifying the difference Iout' between the output current I40' of the first magnetic tunnel junction 40 and the output current I50' of the second magnetic tunnel junction 50 by a fixed gain, and then outputting an amplified value, so that output currents Iout' in different resistive states have a higher degree of differentiation, thereby obtaining a resistive state corresponding to a read instruction more accurately, and reading data with higher accuracy.

Figure 21:
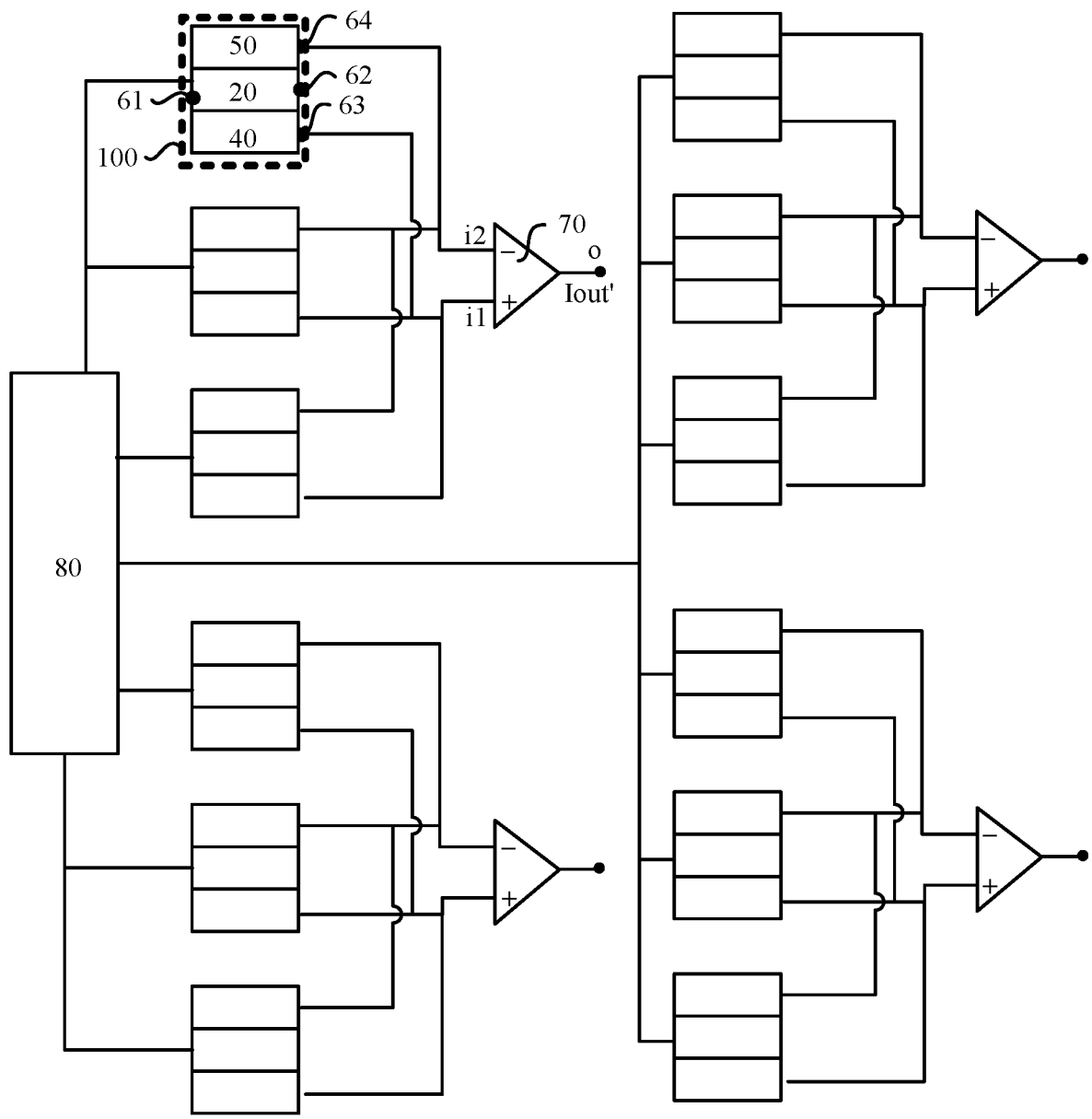
FIG. 21 is a diagram of a structure of another storage chip according to an embodiment of this application.

In some other embodiments, as shown in FIG. 21, a first input end i1 of a differential amplifier 70 is coupled to a third electrode 63, and a second input end i2 of the differential amplifier 70 is coupled to a fourth electrode 64. A first input end i1 of one differential amplifier 70 is coupled to multiple third electrodes 63, and a second input end i2 of one differential amplifier 70 is coupled to multiple fourth electrodes 64.

In this case, a peripheral circuit coupled to the storage component 100 further includes a time-sharing read control circuit 80. The time-sharing read control circuit 80 is coupled to the storage component 100, and is configured to send a time-sharing read instruction to the storage component 100, so that the multiple third electrodes 63 transmit signals to the first input end i1 of the differential amplifier 70 in a time-sharing manner, and the multiple fourth electrodes 64 transmit signals to the second input end i2 of the differential amplifier 70 in a time-sharing manner.

A process in which the differential amplifier 70 processes a current (an output current I40' of the first magnetic tunnel junction 40) input by the first input end i1 and a current (an output current I50' of the second magnetic tunnel junction 50) input by the second input end i2 is the same as that described in FIG. 20. A difference only lies in that: According to an instruction of the time-sharing read control circuit 80, in the storage component 100, only one of the multiple third electrodes 63 transmits a signal to the first input end i1 of the differential amplifier 70 at a same moment, and the multiple fourth electrodes 64 transmit signals to the second input end i2 of the differential amplifier 70 in a time-sharing manner.

It may be understood that, the third electrode 63 and the fourth electrode 64 that transmit signals to the first input end i1 and the second input end i2 of the differential amplifier 70 at a same moment are located on two sides of a same spin orbit coupling layer 20.

According to the storage component 100 provided in this embodiment of this application, a quantity of differential amplifiers 70 can be decreased, so that an area of the storage component 100 is reduced.

An embodiment of this application further provides a computer-readable storage medium. The computer-readable storage medium stores computer instructions. When the computer instructions are run on an electronic device, the electronic device is enabled to perform the foregoing related method operations, to implement the reading method or the writing method in the foregoing embodiment.

An embodiment of this application further provides a computer program product. When the computer program product is run on a computer, the computer is enabled to perform the foregoing related operations, to implement the reading method or the writing method performed by the electronic device in the foregoing embodiment.

It should be noted above that high, medium, and low mentioned in embodiments of this application are relative based on a result value, and are not limited.

The foregoing description is merely an example implementation of this application, but is not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. A storage component comprising:
a first magnetic tunnel junction having a first free layer, a first tunneling layer, and a first fixed layer;
a spin orbit coupling layer; and
a second magnetic tunnel junction having a second free layer, a second tunneling layer, and a second fixed layer, wherein the first free layer and the second free layer are arranged on two opposite surfaces of the spin orbit coupling layer, and wherein the first magnetic tunnel junction, the spin orbit coupling layer, and the second magnetic tunnel junction are sequentially arranged in a stacked manner.

2. The storage component according to claim 1, wherein the first magnetic tunnel junction and the second magnetic tunnel junction are of a same structure.

3. The storage component according to claim 1, wherein the first tunneling layer and the first fixed layer are sequentially arranged on the first free layer in a stacked manner; and/or
wherein the second tunneling layer and the second fixed layer are sequentially arranged on the second free layer in a stacked manner.

4. The storage component according to claim 1, wherein the storage component further comprises a first electrode and a second electrode; and
the first electrode and the second electrode are coupled to two opposite sides of the spin orbit coupling layer.

5. The storage component according to claim 4, wherein the storage component further comprises a third electrode and a fourth electrode; and wherein the third electrode is coupled to the first fixed layer of the first magnetic tunnel junction, and the fourth electrode is coupled to the second fixed layer of the second magnetic tunnel junction.

6. The storage component of claim 5, wherein the second electrode, the third electrode, and the fourth electrode are separately coupled to a reference ground end.

7. A storage chip, comprising the storage component according to claim 1.

8. The storage chip according to claim 7, wherein the storage chip further comprises a differential amplifier, and
wherein a first input end of the differential amplifier is coupled to a third electrode of the storage component, and a second input end of the differential amplifier is coupled to a fourth electrode of the storage component.

9. The storage chip according to claim 8, wherein a first input end of the differential amplifier is coupled to multiple third electrodes, and a second input end of the differential amplifier is coupled to multiple fourth electrodes; and
wherein the storage chip further comprises a time-sharing read control circuit, wherein the time-sharing read control circuit is coupled to the storage component, and is configured to send a time-sharing read instruction to the storage component, so that the multiple third electrodes transmit signals to the first input end of the differential amplifier in a time-sharing manner, and the multiple fourth electrodes transmit signals to the second input end of the differential amplifier in a time-sharing manner.

10. An electronic device comprising the storage chip according to claim 7.

11. An electronic device comprising the storage component according to claim 1.

12. A preparation method of a storage component, the preparation method comprising:
forming, on a substrate, a first magnetic tunnel junction, a spin orbit coupling layer, and a second magnetic tunnel junction that are sequentially arranged in a stacked manner,
wherein the first magnetic tunnel junction comprises a first free layer, a first tunneling layer and a first fixed layer, the second magnetic tunnel junction comprises a second free layer, a second tunneling layer and a second fixed layer, and the first free layer and the second free layer are arranged on two opposite surfaces of the spin orbit coupling layer.

13. The preparation method according to claim 12, wherein forming the first magnetic tunnel junction, the spin orbit coupling layer, and the second magnetic tunnel junction comprises:
forming a first fixed thin film on the substrate;
forming a first tunneling thin film on a surface that is of the first fixed thin film and that is away from the substrate;
forming a first free thin film on a surface that is of the first tunneling thin film and that is away from the first fixed thin film;
forming a spin orbit coupling thin film on a surface that is of the first free thin film and that is away from the first tunneling thin film;
forming a second free thin film on a surface that is of the spin orbit coupling thin film and that is away from the first free thin film;
forming a second tunneling thin film on a surface that is of the second free thin film and that is away from the spin orbit coupling thin film;

forming a second fixed thin film on a surface that is of the second tunneling thin film and that is away from the second free thin film; and patterning the first fixed thin film, the first tunneling thin film, the first free thin film, the spin orbit coupling thin film, the second free thin film, the second tunneling thin film, and the second fixed thin film by using a patterning process, to form the first magnetic tunnel junction that is formed by sequentially stacking the first fixed layer, the first tunneling layer, and the first free layer, the spin orbit coupling layer, and the second magnetic tunnel junction that is formed by sequentially stacking the second free layer, the second tunneling layer, and the second fixed layer.

14. A reading method of a storage component, the reading method comprising:

at the storage component, which comprises a first magnetic tunnel junction, a spin orbit coupling layer, and a second magnetic tunnel junction that are sequentially arranged in a stacked manner:

applying a voltage signal to the spin orbit coupling layer;

reading an output current of the spin orbit coupling layer; and obtaining, based on the output current of the spin orbit coupling layer, data stored in the first magnetic tunnel junction and the second magnetic tunnel junction, wherein the first magnetic tunnel junction has a first free layer, a first tunneling layer and a first fixed layer, wherein the second magnetic tunnel junction has a second free layer, a second tunneling layer and a second fixed layer.

15. The reading method according to claim 14, wherein obtaining the data stored in the first magnetic tunnel junction and the second magnetic tunnel junction comprises:

reading data corresponding to a low resistive state when Iout=Iin+Iish;

reading a medium resistive state when Iout=Iin+1/2 Iish; or reading a high resistive state when Iout=Iin, wherein Iout is the output current of the spin orbit coupling layer, Iin is an in-plane current generated after the voltage signal is applied to the spin orbit coupling layer, and Iish is an inverse spin Hall current generated by an inverse spin Hall effect after the voltage signal is applied to the spin orbit coupling layer.

16. A reading method of a storage component, the reading method comprising:

at the storage component, which comprises a first magnetic tunnel junction, a spin orbit coupling layer, and a second magnetic tunnel junction that are sequentially arranged in a stacked manner:

applying a voltage signal to the spin orbit coupling layer;

reading an output current of the first magnetic tunnel junction and an output current of the second magnetic tunnel junction, wherein the first magnetic tunnel junction has a first free layer, a first tunneling layer and a first fixed layer,, wherein the second magnetic tunnel junction has a second free layer, a second tunneling layer and a second fixed layer; and obtaining, based on the output current of the first magnetic tunnel junction and the output current of the second magnetic tunnel junction, data stored in the first magnetic tunnel junction and the second magnetic tunnel junction.

17. The reading method according to claim 16, wherein obtaining the data stored in the first magnetic tunnel junction and the second magnetic tunnel junction comprises:

reading a low resistive state when Iout'>0;

reading a medium resistive state when Iout'=0; or reading a high resistive state when Iout'<0, wherein Iout' is a difference between the output current of the first magnetic tunnel junction and the output current of the second magnetic tunnel junction.

18. A writing method of a storage component, the writing method comprising:

at the storage component, which comprises a first magnetic tunnel junction, a spin orbit coupling layer, and a second magnetic tunnel junction that are sequentially arranged in a stacked manner:

separately applying a voltage signal to the spin orbit coupling layer and at least one of the first magnetic tunnel junction or the second magnetic tunnel junction, wherein the voltage signal is used to change resistive states of the first magnetic tunnel junction and the second magnetic tunnel junction, so as to write corresponding data into the storage component, wherein the first magnetic tunnel junction has a first free layer, a first tunneling layer and a first fixed layer, wherein the second magnetic tunnel junction has a second free layer, a second tunneling layer and a second fixed layer.

19. The writing method according to claim 18, wherein separately applying the voltage signal to the spin orbit coupling layer and at least one of the first magnetic tunnel junction or the second magnetic tunnel junction comprises:

separately applying the voltage signal to the spin orbit coupling layer and one of the first magnetic tunnel junction and the second magnetic tunnel junction, wherein the voltage signal is used to change a resistive state of one of the first magnetic tunnel junction and the second magnetic tunnel junction, so as to change a resistive state of the storage component, and write, into the storage component, data corresponding to the resistive state of the storage component.

20. The writing method according to claim 18, wherein separately applying the voltage signal to the spin orbit coupling layer and at least one of the first magnetic tunnel junction or the second magnetic tunnel junction comprises:

separately applying the voltage signal to the first magnetic tunnel junction, the second magnetic tunnel junction, and the spin orbit coupling layer, wherein the voltage signal is used to change resistive states of the first magnetic tunnel junction and the second magnetic tunnel junction, so as to change a resistive state of the storage component, and write, into the storage component, data corresponding to the resistive state of the storage component.

* * * * *